US009490035B2

(12) United States Patent
Tsai et al.

(10) Patent No.: US 9,490,035 B2
(45) Date of Patent: Nov. 8, 2016

(54) CENTRALIZED VARIABLE RATE SERIALIZER AND DESERIALIZER FOR BAD COLUMN MANAGEMENT

(71) Applicant: SANDISK TECHNOLOGIES LLC, Plano, TX (US)

(72) Inventors: Wanfang Tsai, Mountain View, CA (US); YenLung Li, San Jose, CA (US); Chen Chen, Mountain View, CA (US)

(73) Assignee: SanDisk Technologies, Inc., Plano, TX (US)

( * ) Notice: Subject to any disclaimer, the term of this patent is extended or adjusted under 35 U.S.C. 154(b) by 25 days.

(21) Appl. No.: 14/104,817

(22) Filed: Dec. 12, 2013

(65) Prior Publication Data

US 2014/0126293 A1 May 8, 2014

Related U.S. Application Data

(63) Continuation-in-part of application No. 13/630,163, filed on Sep. 28, 2012, now Pat. No. 9,076,506.

(51) Int. Cl.
*G11C 7/00* (2006.01)
*G11C 29/00* (2006.01)

(52) U.S. Cl.
CPC ............. *G11C 29/82* (2013.01); *G11C 29/808* (2013.01); *G11C 2207/107* (2013.01)

(58) Field of Classification Search
CPC ...... G11C 5/02; G11C 2207/107; G11C 8/12
See application file for complete search history.

(56) References Cited

U.S. PATENT DOCUMENTS 3,710,348 A 1/1973 Craft
3,895,360 A 7/1975 Cricchi et al.
(Continued)

FOREIGN PATENT DOCUMENTS

CN 1549133 11/2004
JP 61292747 A 12/1986
(Continued)

OTHER PUBLICATIONS

Eitan et al., "NROM: A Novel Localized Trapping, 2-Bit Nonvolatile Memory Cell," *IEEE Electron Device Letters*, vol. 21, No. 11, Nov. 2000, pp. 543-545.
(Continued)

*Primary Examiner* — Son Dinh
*Assistant Examiner* — Uyen B Tran
(74) *Attorney, Agent, or Firm* — Sterne, Kessler, Goldstein & Fox PLLC

(57) ABSTRACT

A memory circuit includes an array subdivided into multiple divisions, each connectable to a corresponding set of access circuitry. A serializer/deserializer circuit is connected to a data bus and the access circuitry to convert data between a (word-wise) serial format on the bus and (multi-word) parallel format for the access circuitry. Column redundancy circuitry is connect to the serializer/deserializer circuit to provide defective column information about the array. In converting data from a serial to a parallel format, the serializer/deserializer circuit skips words of the data in the parallel format based on the defective column information indicating that the location corresponds to a defective column. In converting data from a parallel to a serial format the serializer/deserializer circuit skips words of the data in the parallel format based on the defective column information indicating that the location corresponds to a defective column.

5 Claims, 34 Drawing Sheets

(56) References Cited

U.S. PATENT DOCUMENTS

| | | |
|---|---|---|
| 4,330,862 A | 5/1982 | Smolik |
| 4,357,685 A | 11/1982 | Daniele et al. |
| 4,426,688 A | 1/1984 | Moxley |
| 4,720,815 A | 1/1988 | Ogawa |
| 4,757,477 A | 7/1988 | Nagayama et al. |
| 5,070,032 A | 12/1991 | Yuan et al. |
| 5,095,344 A | 3/1992 | Harari |
| 5,172,338 A | 12/1992 | Mehrotra et al. |
| 5,200,959 A | 4/1993 | Gross et al. |
| 5,270,979 A | 12/1993 | Harari et al. |
| 5,313,421 A | 5/1994 | Guterman et al. |
| 5,315,541 A | 5/1994 | Harari et al. |
| 5,343,063 A | 8/1994 | Yuan et al. |
| 5,380,672 A | 1/1995 | Yuan et al. |
| 5,386,390 A | 1/1995 | Okitaka |
| 5,418,752 A | 5/1995 | Harari et al. |
| 5,428,621 A | 6/1995 | Mehrotra et al. |
| 5,430,679 A | 7/1995 | Hiltebeitel et al. |
| 5,430,859 A | 7/1995 | Norman et al. |
| 5,442,748 A | 8/1995 | Chang et al. |
| 5,479,370 A | 12/1995 | Furuyama et al. |
| 5,485,425 A | 1/1996 | Iwai et al. |
| 5,570,315 A | 10/1996 | Tanaka et al. |
| 5,595,924 A | 1/1997 | Yuan et al. |
| 5,596,724 A | 1/1997 | Mullins et al. |
| 5,602,987 A | 2/1997 | Harari et al. |
| 5,642,312 A | 6/1997 | Harari |
| 5,657,332 A | 8/1997 | Auclair et al. |
| 5,661,053 A | 8/1997 | Yuan |
| 5,663,901 A | 9/1997 | Wallace et al. |
| 5,712,180 A | 1/1998 | Guterman et al. |
| 5,768,192 A | 6/1998 | Eitan |
| 5,774,397 A | 6/1998 | Endoh et al. |
| 5,783,958 A | 7/1998 | Lysinger |
| 5,822,245 A | 10/1998 | Gupta et al. |
| 5,848,009 A | 12/1998 | Lee et al. |
| 5,862,080 A | 1/1999 | Harari et al. |
| 5,890,192 A | 3/1999 | Lee et al. |
| 5,903,495 A | 5/1999 | Takeuchi et al. |
| 5,930,167 A | 7/1999 | Lee et al. |
| 5,936,971 A | 8/1999 | Harari et al. |
| 6,011,725 A | 1/2000 | Eitan |
| 6,021,463 A | 2/2000 | Belser |
| 6,038,167 A | 3/2000 | Miwa et al. |
| 6,038,184 A | 3/2000 | Naritake |
| 6,046,932 A | 4/2000 | Bill et al. |
| 6,046,935 A | 4/2000 | Takeuchi et al. |
| 6,091,666 A | 7/2000 | Arase et al. |
| 6,151,248 A | 11/2000 | Harari et al. |
| 6,166,990 A * | 12/2000 | Ooishi et al. ............ G11C 7/22 365/194 |
| 6,222,762 B1 | 4/2001 | Guterman et al. |
| 6,230,233 B1 | 5/2001 | Lofgren et al. |
| 6,252,800 B1 | 6/2001 | Chida |
| 6,266,273 B1 | 7/2001 | Conley et al. |
| 6,282,624 B1 | 8/2001 | Kimura et al. |
| 6,353,553 B1 | 3/2002 | Tamada et al. |
| 6,426,893 B1 | 7/2002 | Conley et al. |
| 6,456,528 B1 | 9/2002 | Chen |
| 6,480,423 B2 | 11/2002 | Toda et al. |
| 6,509,851 B1 | 1/2003 | Clark et al. |
| 6,510,488 B2 | 1/2003 | Lasser |
| 6,512,263 B1 | 1/2003 | Yuan et al. |
| 6,522,580 B2 | 2/2003 | Chen et al. |
| 6,523,132 B1 | 2/2003 | Harari et al. |
| 6,560,146 B2 | 5/2003 | Cernea |
| 6,567,307 B1 | 5/2003 | Estakhri |
| 6,581,142 B1 | 6/2003 | Jacobs |
| 6,594,177 B2 | 7/2003 | Matarrese et al. |
| 6,643,180 B2 | 11/2003 | Ikehashi et al. |
| 6,657,891 B1 | 12/2003 | Shibata et al. |
| 6,732,229 B1 * | 5/2004 | Leung et al. ............ G11C 29/78 365/200 |
| 6,771,536 B2 | 8/2004 | Li et al. |
| 6,813,184 B2 | 11/2004 | Lee |
| 6,853,596 B2 | 2/2005 | Cheung |
| 6,870,768 B2 | 3/2005 | Cernea et al. |
| 6,967,873 B2 | 11/2005 | Hamilton et al. |
| 6,985,388 B2 | 1/2006 | Cernea |
| 6,990,018 B2 | 1/2006 | Tanaka et al. |
| 6,990,025 B2 | 1/2006 | Kirihata et al. |
| 6,996,017 B2 | 2/2006 | Scheuerlein et al. |
| 7,027,330 B2 | 4/2006 | Park |
| 7,039,781 B2 | 5/2006 | Iwata et al. |
| 7,057,939 B2 | 6/2006 | Li et al. |
| 7,058,818 B2 | 6/2006 | Dariel |
| 7,076,611 B2 | 7/2006 | Steere et al. |
| 7,110,294 B2 | 9/2006 | Kawai |
| 7,158,421 B2 | 1/2007 | Li et al. |
| 7,170,802 B2 | 1/2007 | Cernea et al. |
| 7,206,230 B2 | 4/2007 | Li et al. |
| 7,224,605 B1 | 5/2007 | Moogat et al. |
| 7,257,689 B1 | 8/2007 | Baird |
| 7,299,314 B2 | 11/2007 | Lin et al. |
| 7,310,347 B2 | 12/2007 | Lasser |
| 7,345,928 B2 | 3/2008 | Li |
| 7,405,985 B2 | 7/2008 | Cernea et al. |
| 7,411,846 B2 | 8/2008 | Terzioglu |
| 7,420,847 B2 | 9/2008 | Li |
| 7,426,623 B2 | 9/2008 | Lasser |
| 7,447,070 B2 | 11/2008 | Cernea |
| 7,490,283 B2 | 2/2009 | Gorobets et al. |
| 7,493,457 B2 | 2/2009 | Murin |
| 7,502,254 B2 | 3/2009 | Murin et al. |
| 7,502,259 B2 | 3/2009 | Gorobets |
| 7,663,950 B2 | 2/2010 | Moogat et al. |
| 7,974,124 B2 | 7/2011 | Chibvongodze et al. |
| 7,983,374 B2 | 7/2011 | Lei et al. |
| 8,144,512 B2 | 3/2012 | Huang et al. |
| 8,681,548 B2 | 3/2014 | Liu et al. |
| 8,730,722 B2 | 5/2014 | Koh et al. |
| 8,750,042 B2 | 6/2014 | Sharon et al. |
| 8,775,901 B2 | 7/2014 | Sharon et al. |
| 8,842,473 B2 | 9/2014 | Tsai |
| 9,076,506 B2 * | 7/2015 | Tsai ....................... G11C 19/00 |
| 2001/0000023 A1 | 3/2001 | Kawahara et al. |
| 2002/0118574 A1 | 8/2002 | Gongwer et al. |
| 2003/0007385 A1 | 1/2003 | Hosono et al. |
| 2003/0182317 A1 | 9/2003 | Kahn et al. |
| 2003/0223274 A1 | 12/2003 | Cernea |
| 2004/0060031 A1 | 3/2004 | Cernea |
| 2004/0109357 A1 | 6/2004 | Cernea et al. |
| 2004/0218634 A1 | 11/2004 | Peng et al. |
| 2005/0073884 A1 | 4/2005 | Gonzalez et al. |
| 2005/0078517 A1 | 4/2005 | Abedifard |
| 2005/0144365 A1 | 6/2005 | Gorobets et al. |
| 2005/0180536 A1 | 8/2005 | Payne et al. |
| 2005/0213393 A1 | 9/2005 | Lasser |
| 2006/0126390 A1 | 6/2006 | Gorobets et al. |
| 2006/0136656 A1 | 6/2006 | Conley et al. |
| 2006/0140007 A1 | 6/2006 | Cernea et al. |
| 2006/0161728 A1 | 7/2006 | Bennett et al. |
| 2007/0061502 A1 | 3/2007 | Lasser |
| 2007/0065119 A1 | 3/2007 | Pomerantz |
| 2007/0091677 A1 | 4/2007 | Lasser |
| 2007/0103977 A1 | 5/2007 | Conley et al. |
| 2007/0103978 A1 | 5/2007 | Conley et al. |
| 2007/0159652 A1 | 7/2007 | Sato |
| 2007/0180346 A1 | 8/2007 | Murin |
| 2007/0186032 A1 | 8/2007 | Sinclair et al. |
| 2007/0211530 A1 | 9/2007 | Nakano |
| 2007/0220197 A1 | 9/2007 | Lasser |
| 2007/0220935 A1 | 9/2007 | Cernea |
| 2007/0237006 A1 | 10/2007 | Murin et al. |
| 2007/0260808 A1 | 11/2007 | Raines et al. |
| 2007/0268745 A1 | 11/2007 | Lasser |
| 2007/0283081 A1 | 12/2007 | Lasser |
| 2007/0285980 A1 | 12/2007 | Shimizu et al. |
| 2008/0062761 A1 | 3/2008 | Tu et al. |
| 2008/0104309 A1 | 5/2008 | Cheon et al. |
| 2008/0104312 A1 | 5/2008 | Lasser |
| 2008/0147996 A1 | 6/2008 | Jenkins et al. |
| 2008/0159012 A1 | 7/2008 | Kim |
| 2008/0181000 A1 | 7/2008 | Lasser |

(56) References Cited

U.S. PATENT DOCUMENTS

| | | |
|---|---|---|
| 2008/0209112 A1 | 8/2008 | Yu et al. |
| 2008/0244338 A1 | 10/2008 | Mokhlesi et al. |
| 2008/0244367 A1 | 10/2008 | Chin et al. |
| 2008/0250220 A1 | 10/2008 | Ito |
| 2008/0250300 A1 | 10/2008 | Mokhlesi et al. |
| 2008/0279005 A1 | 11/2008 | France |
| 2008/0294814 A1 | 11/2008 | Gorobets |
| 2008/0301532 A1 | 12/2008 | Uchikawa et al. |
| 2008/0310224 A1 | 12/2008 | Roohparvar et al. |
| 2009/0067244 A1 | 3/2009 | Li |
| 2009/0089481 A1 | 4/2009 | Kapoor et al. |
| 2009/0089520 A1 | 4/2009 | Saha et al. |
| 2009/0094482 A1 | 4/2009 | Zilberman |
| 2009/0172498 A1 | 7/2009 | Shlick et al. |
| 2009/0310408 A1 | 12/2009 | Lee et al. |
| 2010/0107004 A1 | 4/2010 | Bottelli et al. |
| 2010/0157641 A1 | 6/2010 | Shalvi et al. |
| 2010/0172179 A1 | 7/2010 | Gorobets et al. |
| 2010/0172180 A1 | 7/2010 | Paley et al. |
| 2010/0174845 A1 | 7/2010 | Gorobets et al. |
| 2010/0174846 A1 | 7/2010 | Paley et al. |
| 2010/0174847 A1 | 7/2010 | Paley et al. |
| 2010/0254198 A1 | 10/2010 | Bringivijayaraghavan et al. |
| 2010/0287217 A1 | 11/2010 | Borchers et al. |
| 2010/0325351 A1 | 12/2010 | Bennett |
| 2011/0002169 A1 | 1/2011 | Li et al. |
| 2011/0063909 A1 | 3/2011 | Komatsu |
| 2011/0099460 A1 | 4/2011 | Dusija et al. |
| 2012/0008384 A1 | 1/2012 | Li et al. |
| 2012/0008405 A1 | 1/2012 | Shah et al. |
| 2012/0008410 A1 | 1/2012 | Huynh et al. |
| 2012/0120733 A1 | 5/2012 | Son et al. |
| 2014/0092690 A1 | 4/2014 | Tsai |
| 2014/0126293 A1 | 5/2014 | Tsai et al. |

FOREIGN PATENT DOCUMENTS

| | | |
|---|---|---|
| JP | 01128297 | 5/1989 |
| JP | 06150666 A | 5/1994 |
| WO | WO 98/44420 | 10/1998 |
| WO | WO 00/49488 | 8/2000 |
| WO | WO 03/025939 A2 | 3/2003 |
| WO | WO 03/027828 | 4/2003 |
| WO | WO 2006/064318 | 6/2006 |
| WO | WO 2007/141783 | 12/2007 |

OTHER PUBLICATIONS

U.S. Appl. No. 61/142,620 entitled "Non-Volatile Memory and Method With Improved Block Management System," filed Jan. 5, 2009, 144 pages.

U.S. Appl. No. 12/348,819 entitled "Wear Leveling for Non-Volatile Memories: Maintenance of Experience Count and Passive Techniques," filed Jan. 5, 2009, 73 pages.

U.S. Appl. No. 12/348,825 entitled "Spare Block Management in Non-Volatile Memories," filed Jan. 5, 2009, 76 pages.

U.S. Appl. No. 12/348,891 entitled "Non-Volatile Memory and Method With Write Cache Partitioning," filed Jan. 5, 2009, 151 pages.

U.S. Appl. No. 12/348,895 entitled "Nonvolatile Memory With Write Cache Having Flush/Eviction Methods," filed Jan. 5, 2009, 151 pages.

U.S. Appl. No. 12/348,899 entitled "Non-Volatile Memory and Method With Write Cache Partition Management Methods," filed Jan. 5, 2009, 149 pages.

U.S. Appl. No. 12/051,462 entitled "Adaptive Algorithm in Cache Operation with Dynamic Data Latch Requirements," filed Mar. 19, 2008, 20 pages.

U.S. Appl. No. 12/051,492 entitled "Different Combinations of Wordline Order and Look-Ahead Read to Improve Flash Memory Performance," filed Mar. 19, 2008, 20 pages.

U.S. Appl. No. 12/478,997 entitled Folding Data Stored in Binary Format into Multi-State Format Within Non-Volatile Devices, filed Jun. 5, 2009, 52 pages.

"Numonyx Sector-Based Compact File System (SCFS) Software is a Feature-Rich Flash Solution," *Numonyx*, Nov. 3, 2009, 2 pages.

"SanDisk, Toshiba Develop 32-Nanometer NAND Flash Technology," *SanDisk Corporation and Toshiba Corporation*, Feb. 11, 2009, www.physorg.com/news153597019.html, 9 pages.

U.S. Appl. No. 12/642,740 entitled "Atomic Program Sequence and Write Abort Detection," filed Dec. 18, 2009, 60 pages.

U.S. Appl. No. 12/642,584 entitled "Maintaining Updates of Multi-Level Non-Volatile Memory in Binary Non-Volatile Memory," filed Dec. 18, 2009, 74 pages.

U.S. Appl. No. 12/642,611 entitled "Non-Volatile Memory with Multi-Gear Control Using On-Chip Folding of Data," filed Dec. 18, 2009, 74 pages.

U.S. Appl. No. 12/642,649 entitled "Data Transfer Flows for On-Chip Folding," filed Dec. 18, 2009, 73 pages.

Choudhuri et al., "Performance Improvement of Block Based NAND Flash Translation Layer," CODES + ISSS '07, Salzburg, Austria, Sep. 2007, pp. 257-262.

Kang et al., "A Superblock-Based Flash Translation Layer for NAND Flash Memory," EMSOFT'06, Oct. 2006, pp. 161-170.

Im et al., "Storage Architecture and Software Support for SLC/MLC Combined Flash Memory," Mar. 2009, ACM, SAC'09, pp. 1664-1669.

Chang et al., "Real-Time Garbage Collection for Flash-Memory Storage Systems of Real-Time Embedded Systems," Nov. 2004, ACM, ACM Transactions on Embedded Computing Systems, vol. 3, pp. 837-863.

Lee et al., "Block Recycling Schemes and Their Cost-Based Optimization in NAND Flash Memory Based Storage System," Oct. 2007, ACM., EMSOFT '07, pp. 174-182.

U.S. Appl. No. 13/630,163, filed Sep. 28, 2013, 67 pages.
U.S. Appl. No. 13/630,278, filed Sep. 28, 2013, 67 pages.

\* cited by examiner

Input Logic Truth Table

| Transfer Mode | ONE | ONEB<0> | ONEB<1> | PBus (Input) | BSI (Output) |
|---|---|---|---|---|---|
| Pass-Through | 1 | 0 | 0 | PBus | PBus |
| Invert | 0 | 1 | 1 | PBus | PBus* |
| Float | 1 | 1 | 0 | PBus | Float |

Output Logic Truth Table

| Transfer Mode | PINV | NINV | PDIR | NDIR | MTCH | PBus (Output) |
|---|---|---|---|---|---|---|
| Pass-Through | D | D | D | 1 | 0 | 0 |
|  | 0 | D | D | D | 1 | 1 |
| Invert | D | D | 0 | D | 0 | 1 |
|  | D | 1 | D | D | 1 | 0 |
| Float | D | D | D | D | X | Z |
| Pre-Charge | 0 | D | 0 | D | X | 1 |

(Default Values: PINV=1, NINV=0, PDIR=1, NDIR=0)

| Bytes | 0 | 1 | 580 | 581 | 10 | 11 | 590 | 591 | 20 | 21 | 600 | 601 | 560 | 561 | 1140 | 1141 | 570 | 571 | 1150 | 1151 |
|---|---|---|---|---|---|---|---|---|---|---|---|---|---|---|---|---|---|---|---|---|
| | BYCOM0 | | | BYCOM1 | | | BYCOM2 | | | BYCOM56 | | | BYCOM57 | | |
| | | | | | | | | | DIV0 | | | | | | |

| Bytes | 2 | 3 | 582 | 583 | 12 | 13 | 592 | 593 | 22 | 23 | 602 | 603 | 562 | 563 | 1142 | 1143 | 572 | 573 | 1152 | 1153 |
|---|---|---|---|---|---|---|---|---|---|---|---|---|---|---|---|---|---|---|---|---|
| | BYCOM0 | | | BYCOM1 | | | BYCOM2 | | | BYCOM56 | | | BYCOM57 | | |
| | | | | | | | | | DIV1 | | | | | | |

| Bytes | 4 | 5 | 584 | 585 | 14 | 15 | 594 | 595 | 24 | 25 | 604 | 605 | 564 | 565 | 1144 | 1145 | 574 | 575 | 1154 | 1155 |
|---|---|---|---|---|---|---|---|---|---|---|---|---|---|---|---|---|---|---|---|---|
| | BYCOM0 | | | BYCOM1 | | | BYCOM2 | | | BYCOM56 | | | BYCOM57 | | |
| | | | | | | | | | DIV2 | | | | | | |

| Bytes | 6 | 7 | 586 | 587 | 16 | 17 | 596 | 597 | 26 | 27 | 606 | 607 | 566 | 567 | 1146 | 1147 | 576 | 577 | 1156 | 1157 |
|---|---|---|---|---|---|---|---|---|---|---|---|---|---|---|---|---|---|---|---|---|
| | BYCOM0 | | | BYCOM1 | | | BYCOM2 | | | BYCOM56 | | | BYCOM57 | | |
| | | | | | | | | | DIV3 | | | | | | |

| Bytes | 8 | 9 | 588 | 589 | 18 | 19 | 598 | 599 | 28 | 29 | 608 | 609 | 568 | 569 | 1148 | 1149 | 578 | 579 | 1158 | 1159 |
|---|---|---|---|---|---|---|---|---|---|---|---|---|---|---|---|---|---|---|---|---|
| | BYCOM0 | | | BYCOM1 | | | BYCOM2 | | | BYCOM56 | | | BYCOM57 | | |
| | | | | | | | | | DIV4 | | | | | | |

FIG. 14

CENTRALIZED VARIABLE RATE SERIALIZER AND DESERIALIZER FOR BAD COLUMN MANAGEMENT

CROSS-REFERENCE TO RELATED APPLICATIONS

This application is a continuation in part of U.S. patent application Ser. No. 13/630,163, filed on Sep. 28, 2012, and is related to U.S. patent application Ser. No. 13/630,278, also filed on Sep. 28, 2012, both of which are hereby incorporated by reference in their entirety.

FIELD OF THE INVENTION

This invention relates generally to converting data from a parallel to a serial format and, more specifically, to techniques for variable rate parallel to serial shift registers.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

EXAMPLES OF NON-VOLATILE MEMORY CELLS

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is affected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903,495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $T_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

United States Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

A first set of aspects relate to a memory circuit that includes an array of non-volatile memory cells formed along multiple word lines and multiple columns. The columns are subdivided into N divisions, each division formed of a plurality of contiguous columns, and where the word lines span all of the columns of the first array. The memory circuit also includes N sets of access circuitry, each connectable to the columns of a corresponding division of the first array. (N is an integer greater than one.) A deserializer circuit is connected to a data bus to receive data in a word-wide serial data format and connectable to the sets of access circuitry to transfer the received data to it, where the deserializer circuit transfers each of N words of data to a corresponding one of the first plurality of sets of access circuitry in parallel according to a first clock signal. Column redundancy circuitry is connected to the deserializer circuit to provide it with defective column information. In converting data from a serial to a parallel format, the deserializer circuit skips words of the data in the parallel format based on the defective column information indicating that the columns location corresponds to a defective column.

An additional set of aspects concern a memory circuit that includes an array of non-volatile memory cells formed along multiple word lines and multiple columns. The columns are subdivided into N divisions, each division formed of a plurality of contiguous columns, and where the word lines span all of the columns of the first array. The memory circuit also includes N sets of access circuitry, each connectable to the columns of a corresponding division of the first array. (N is an integer greater than one.) A serializer circuit is connected to the sets of access circuitry to receive in parallel each of N words of data from a corresponding one of the sets of access circuitry and is connected to a data bus to transfer to it the received data in a word-wide serial data format according to a first clock signal. Column redundancy circuitry is connected to the serializer circuit to provide it with defective column information. In converting data from a parallel to a serial format, the serializer circuit skips words of the data in the parallel format based on the defective column information indicating that the column's location corresponds to a defective column.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 14 is an example of how words of data are distributed across the divisions.

DETAILED DESCRIPTION OF THE PREFERRED EMBODIMENTS

Figure 7A:
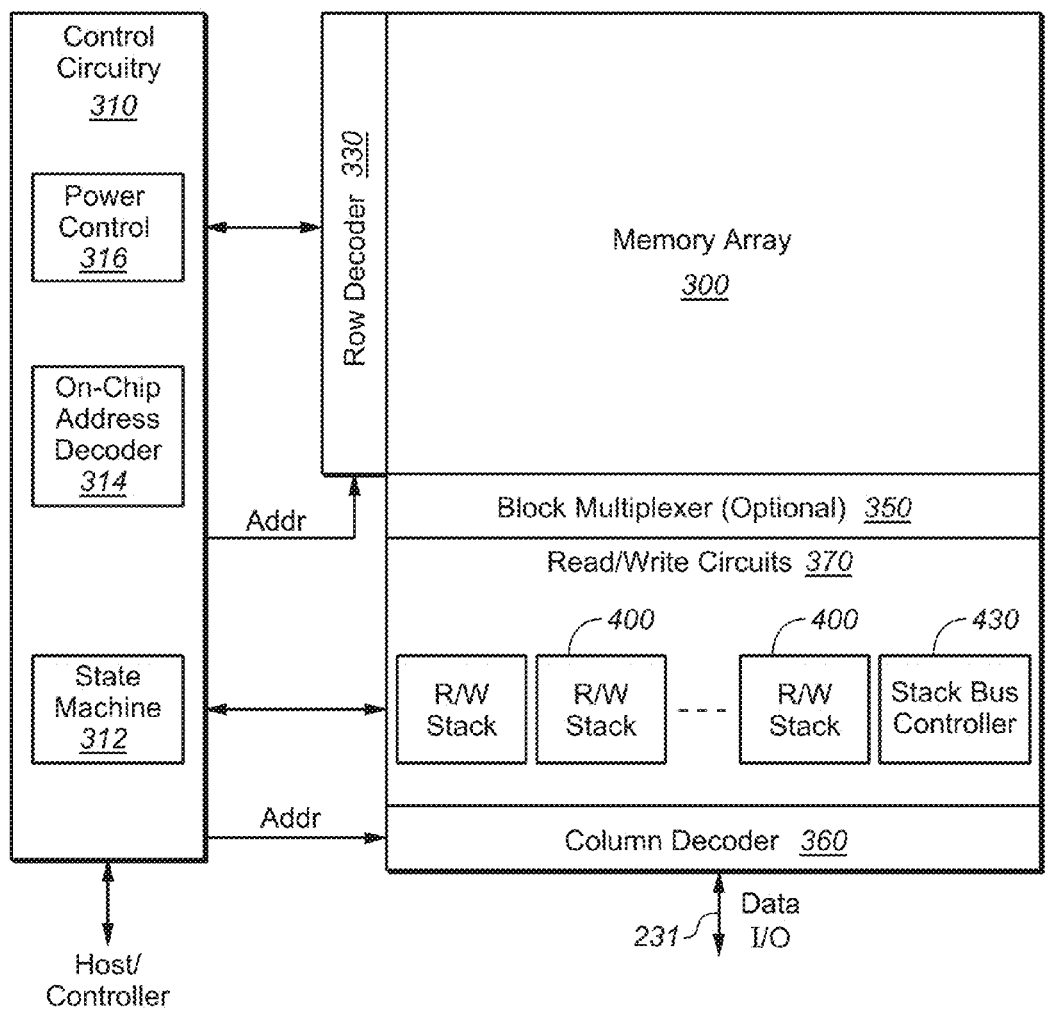
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 7B:
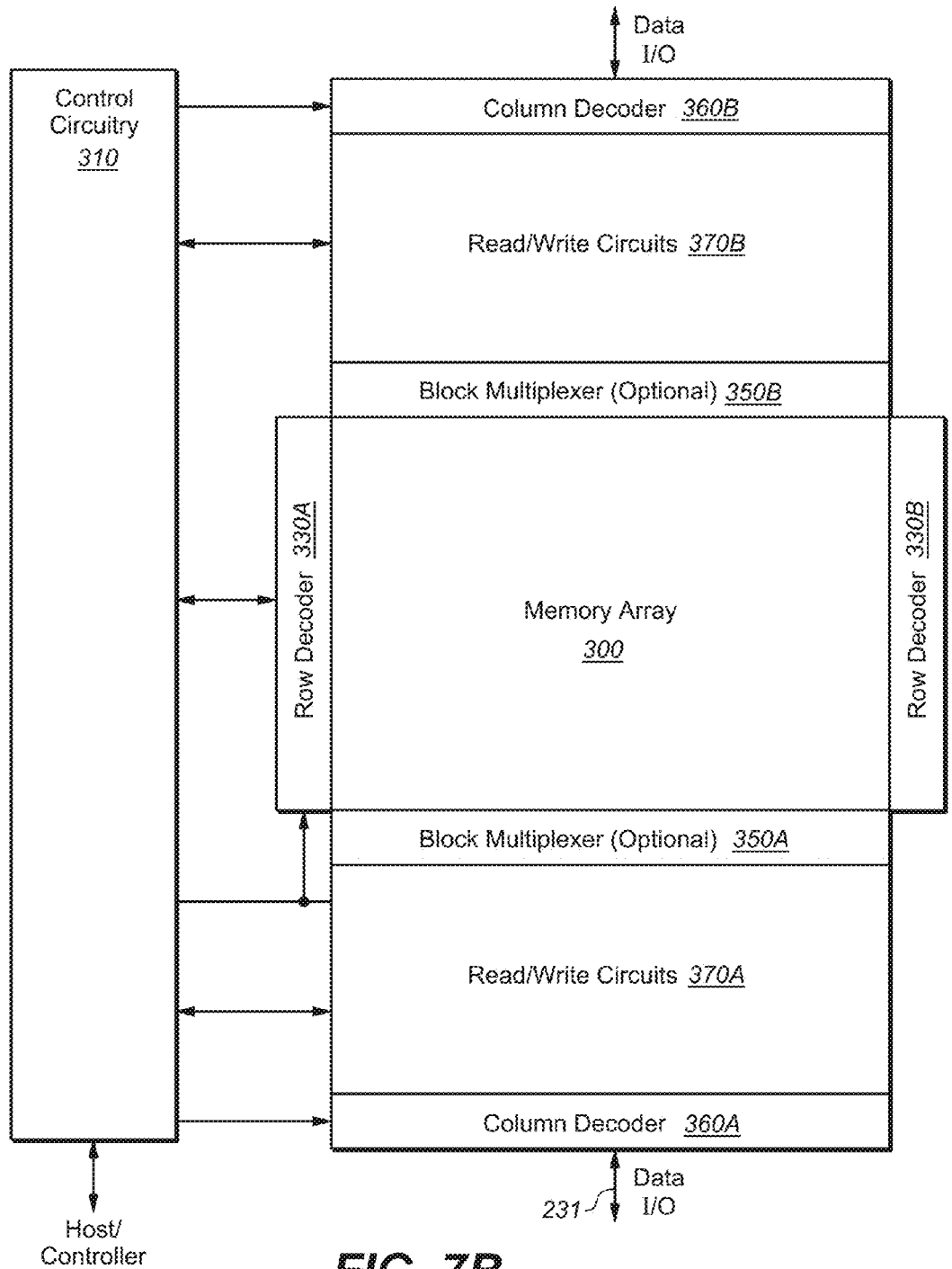
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
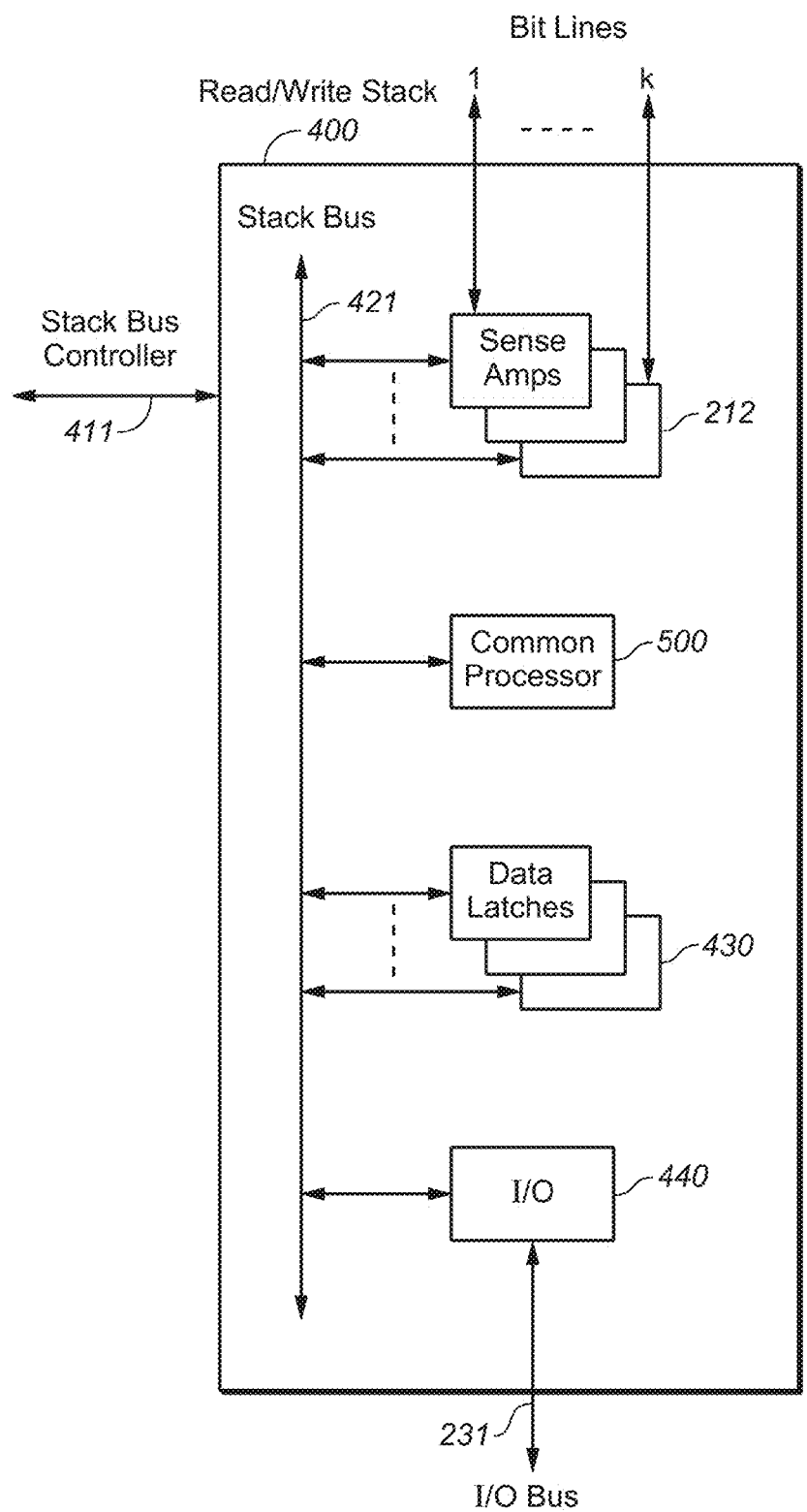
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
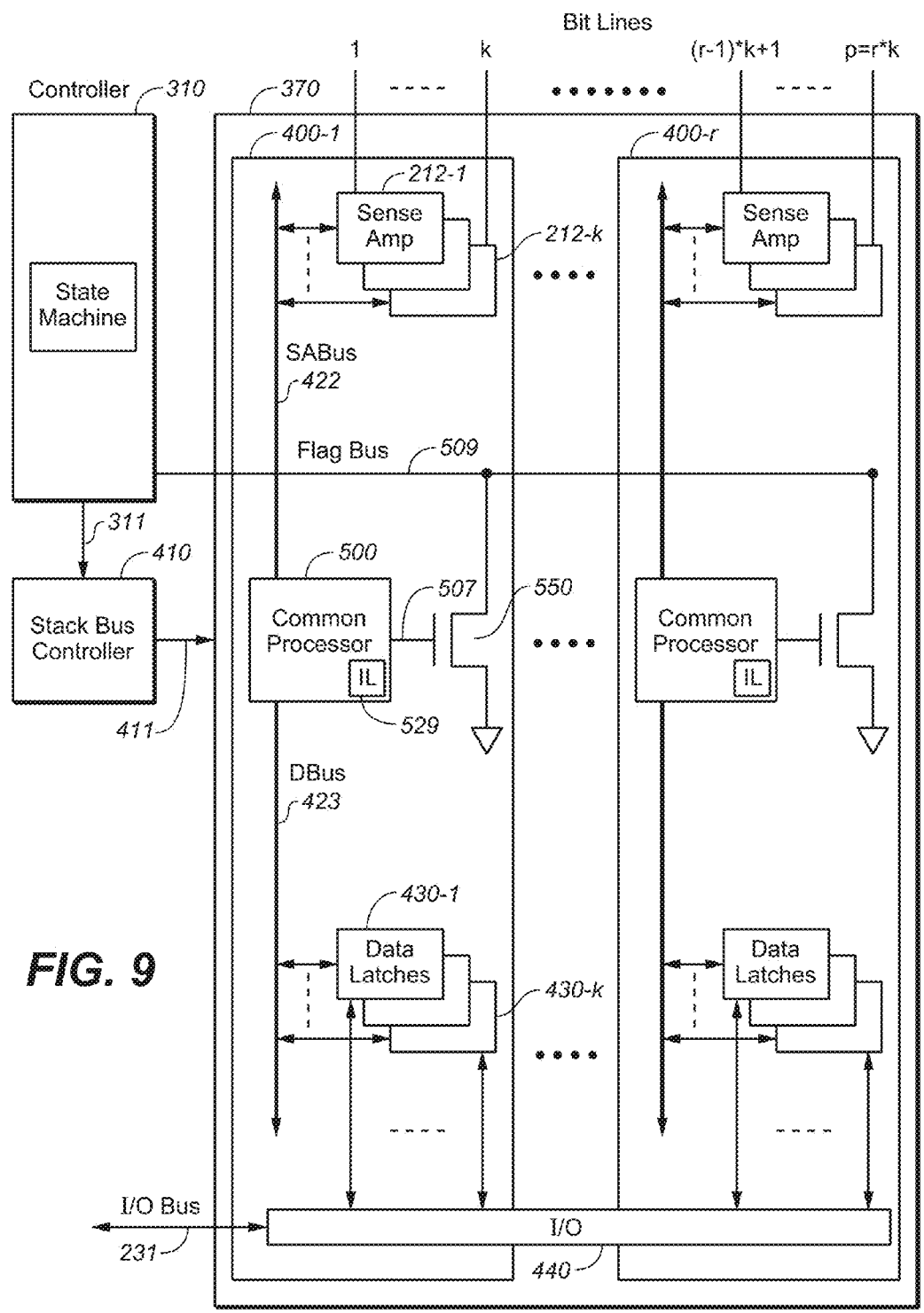
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7E. Each read/write stack 400 operates on a group of k bit lines in parallel. If a page has p=r*k bit lines, there will be r read/write stacks, 400-1, . . . , 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-$k$ servicing a segment of k memory cells in parallel. A preferred sense amplifier is disclosed in United States Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 431 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-$k$, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks. (The isolation latch IL 529 is discussed in the following section on bad column management.)

Figure 10:
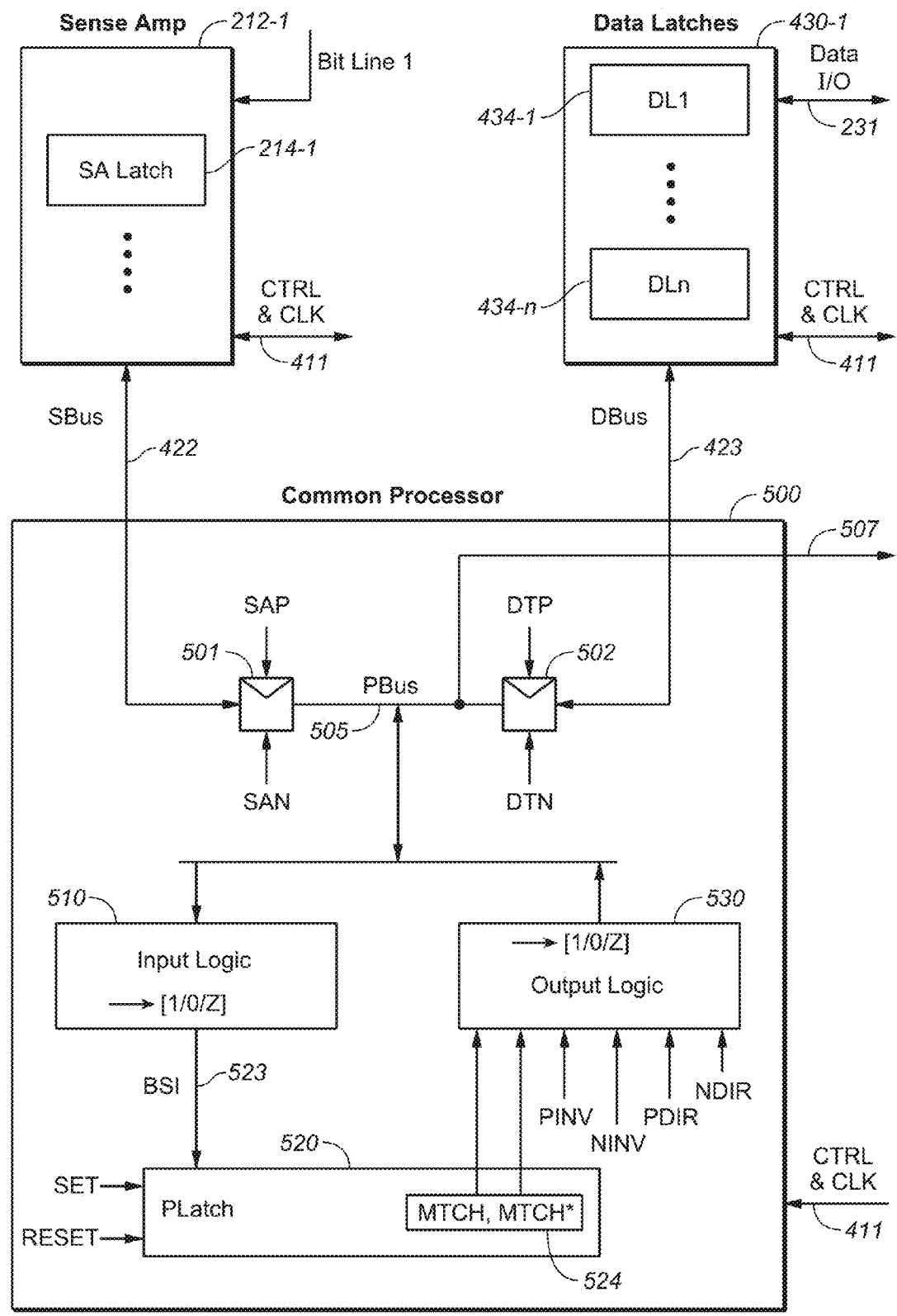
FIG. 10 illustrates an improved embodiment of the common processor shown in FIG. 9.

FIG. 10 illustrates an improved embodiment of the common processor shown in FIG. 9. The common processor 500 comprises a processor bus, PBUS 505 for communication with external circuits, an input logic 510, a processor latch PLatch 520 and an output logic 530.

The input logic 510 receives data from the PBUS and outputs to a BSI node as a transformed data in one of logical states "1", "0", or "Z" (float) depending on the control signals from the stack bus controller 410 via signal lines 411. A Set/Reset latch, PLatch 520 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, . . . , 434-n for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
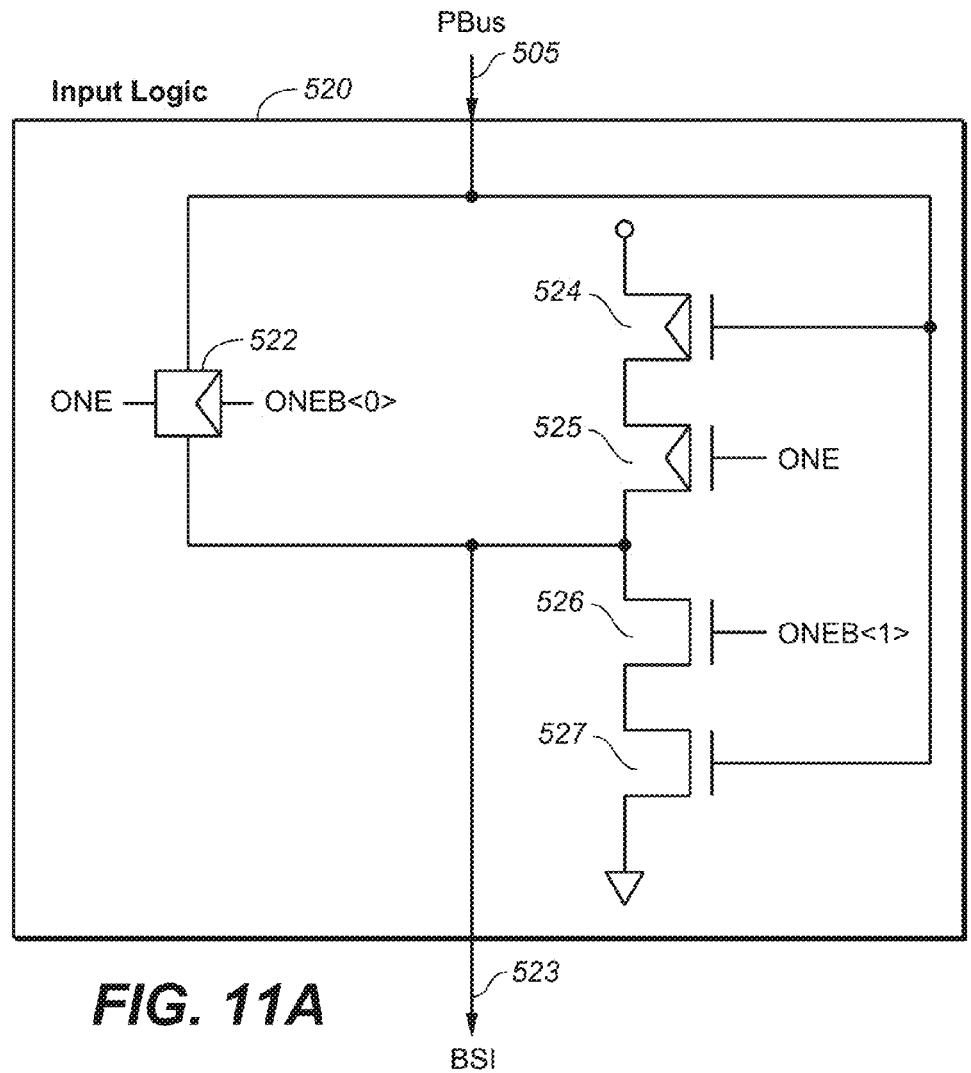
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to Vdd, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONEB<1> at "1". This will disable the transfer gate 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
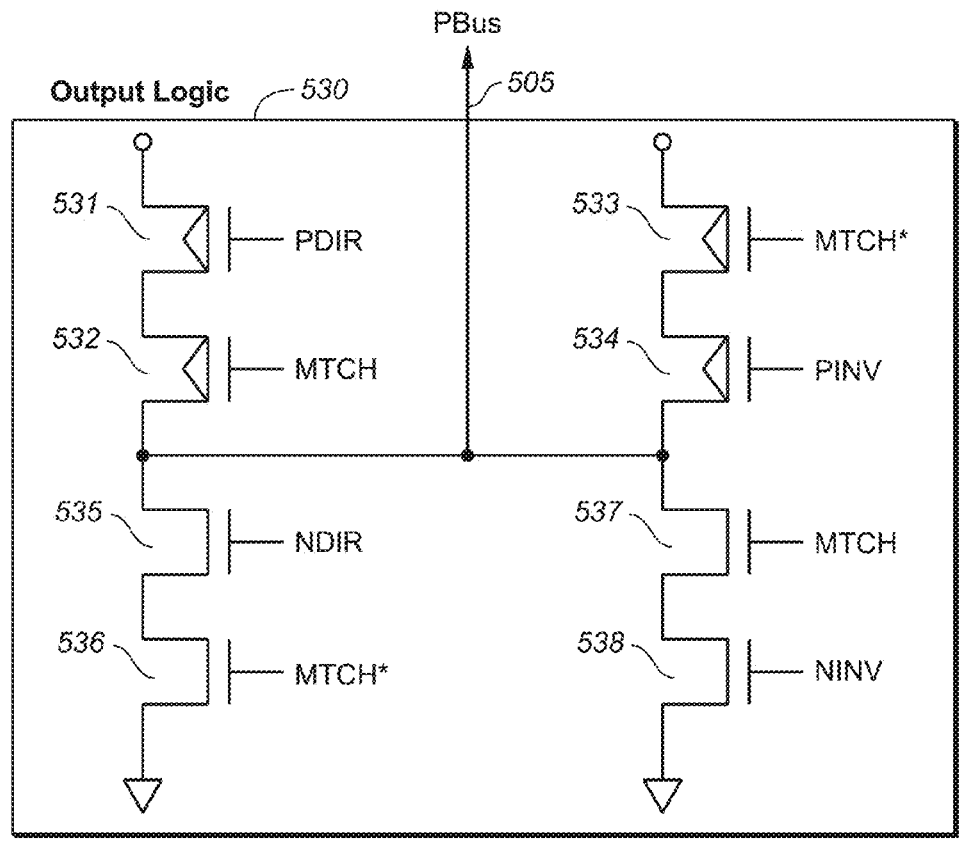
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 520. The output logic 530 receives the data MTCH and MTCH* from the output of PLatch 520 and depending on the control signals, outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to Vdd, and is able to pull up the PBUS when MTCH is at "0". A second pull-up circuit comprises p-transistors 533 and 534 in series to ground and is able to pull up the PBUS when MTCH is at "1". Similarly, a first pull-down circuit comprises n-transistors 535 and 536 in series to Vdd, and is able to pull down the PBUS when MTCH is at "0". A second pull-up circuit comprises n-transistors 537 and 538 in series to ground and is able to pull up the PBUS when MTCH is at "1".

One feature of the invention is to constitute the pull-up circuits with PMOS transistors and the pull-down circuits with NMOS transistors. Since the pull by the NMOS is much stronger than that of the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRECHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common processor operations are developed more fully in U.S. patent publication number US-2006-0140007-A1, which is hereby incorporated in its entirety by this reference.

Column Redundancy Circuitry

Non-volatile memories, such as those described in the preceding sections, often have failures on the column related circuitry, which can show up as bit line shorts, open bit lines, and data latch read/write failures, for example. As the scale of memory devices decrease, while the lengths of bit lines and word lines grow, such memory circuits become more susceptible to bit line and word line failures. (Methods of detecting and dealing with defective word lines are discussed in US patent publication and application numbers: US-2012-0008405-A1; US-2012-0008384-A1; US-2012-0008410-A1; Ser. No. 13/193,148; Ser. No. 13/332,780; and Ser. No. 13/411,115.) To reliably store user data, it needs to be written into and accessed from good columns, instead of bad columns. These bad columns need to be ignored and/or replaced during memory data input and output operations. This section presents a column redundant circuit to reduce circuit size and improve performance. User data is grouped in an interleaved manner so that data belonging to consecutive logical address will be distributed into different physical locations. For example, all column data can be physically grouped into, say, 5 divisions and user data can be written into or accessed from one division after another consecutively. Each division has its own clock control. The column redundancy block can generate bad column locations' information and send it to control logic to switch the user clock to a different division clock, thereby skipping bad columns. By controlling the clocks for different columns, the user can directly access good columns without touching bad columns.

A number of previous approaches are known for addressing defective columns, some of which are discussed in U.S. Pat. Nos. 6,985,388; 7,170,802; 7,663,950; 7,974,124; US patent publication number US-2011-0002169-A1; and U.S. patent application Ser. No. 13/420,961 filed Mar. 15, 2012. For example, in some memory designs, a number of spare columns are set aside and the column redundancy circuits use spare columns to replace the defective columns, so that when a defective column is to be accessed, it is remapped to a replacement form the set of spares. This solution has the drawback that as the spare columns can also have defects, these will in turn need other spare columns to repair. High speed operation is also a concern in such an arrangement. In another arrangement, the external controller stores the bad column locations and ignores that columns' data. This solution requires the controller to read from memory during power-on and retrieve any bad column data. When the number of bad columns increases, the unused data (bad column) input/output can reduce the effective data performance. Therefore, memory circuits could benefit from better column redundancy circuitry, particularly if implemented inside the memory circuit and in a way that can be transparent to the controller so the performance is not adversely affected.

Figure 1A:
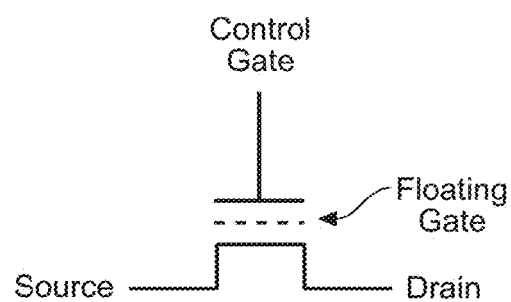
FIGS. 1A-1E illustrate schematically different examples of non-volatile memory cells.
Figure 1B:
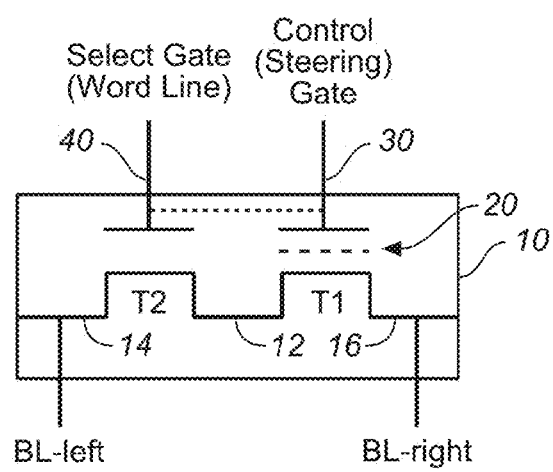
Figure 1C:
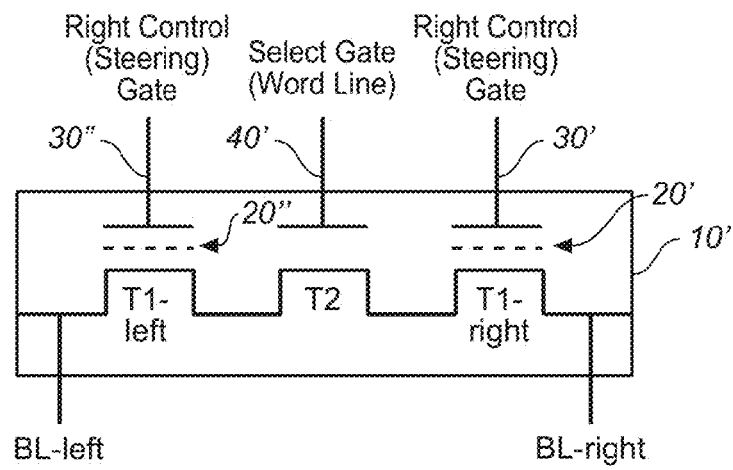
Figure 1D:
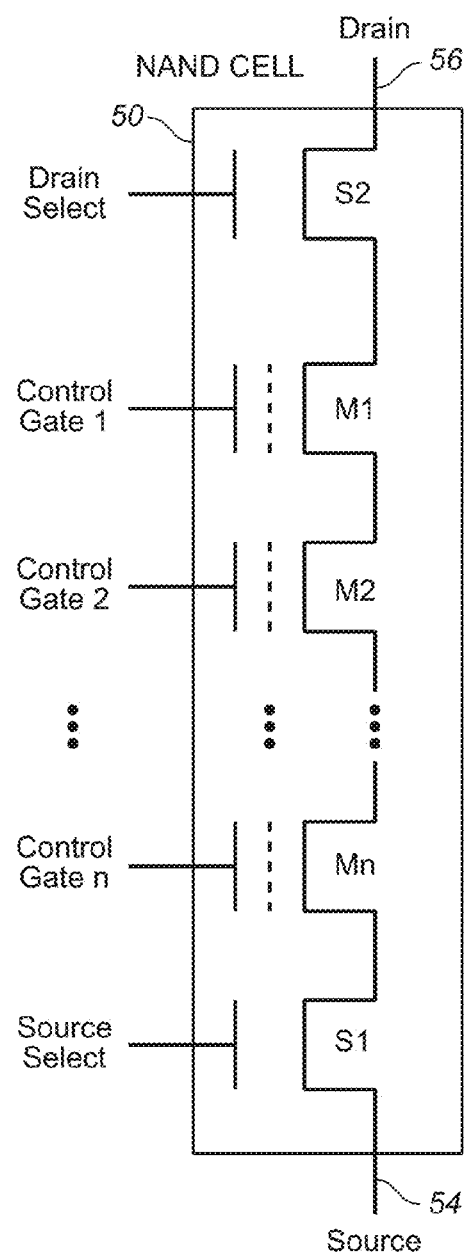
Figure 1E:
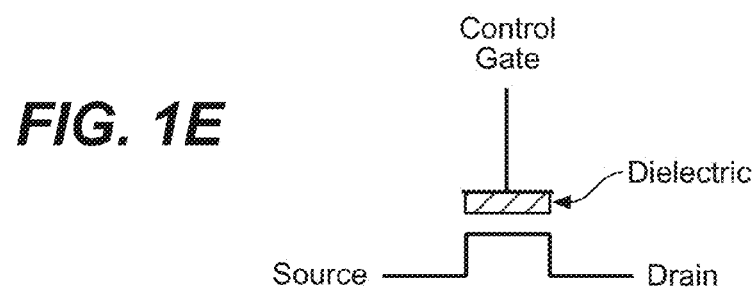
Figure 2:
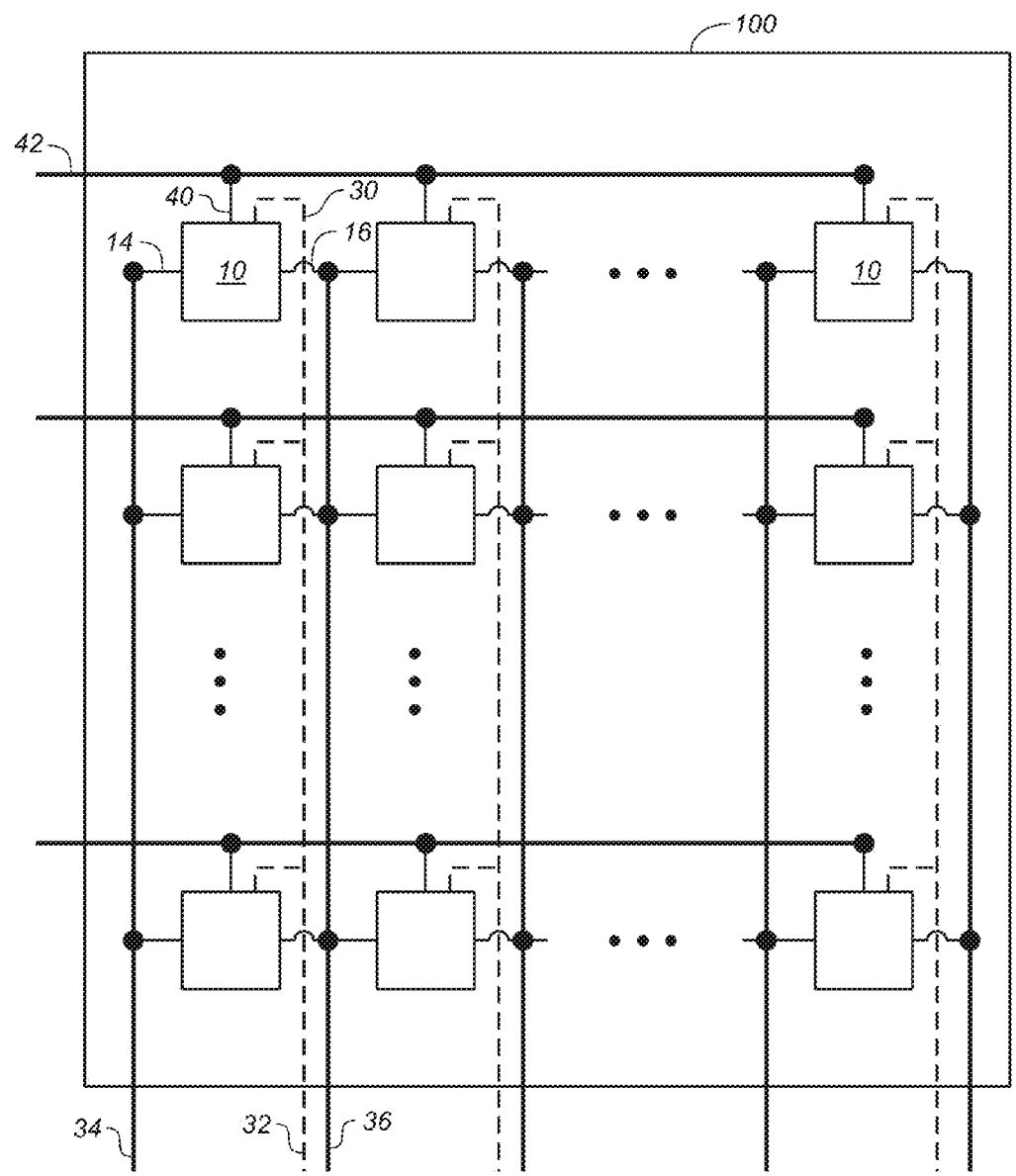
FIG. 2 illustrates an example of an NOR array of memory cells.
Figure 3:
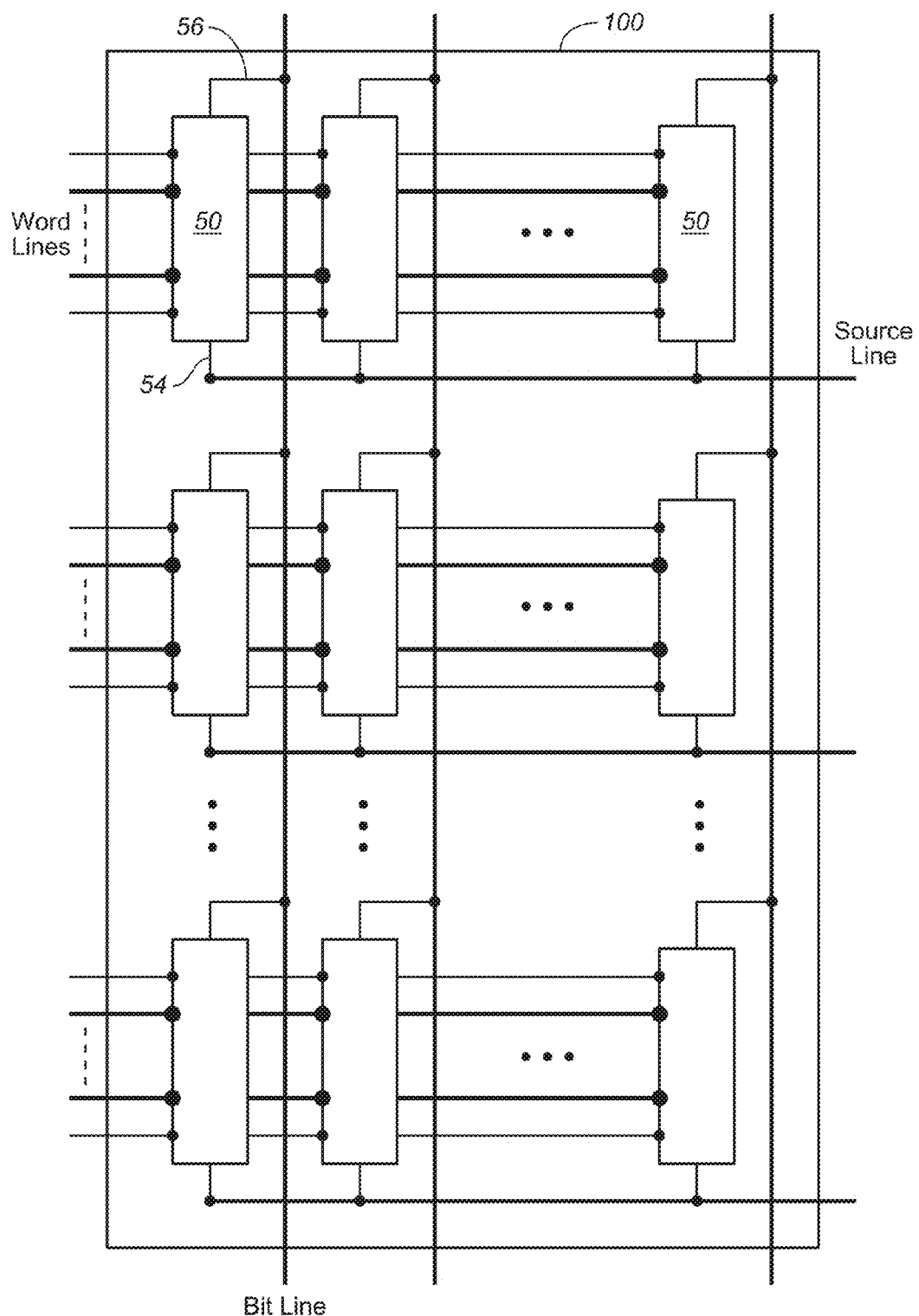
FIG. 3 illustrates an example of an NAND array of memory cells, such as that shown in FIG. 1D.
Figure 4:
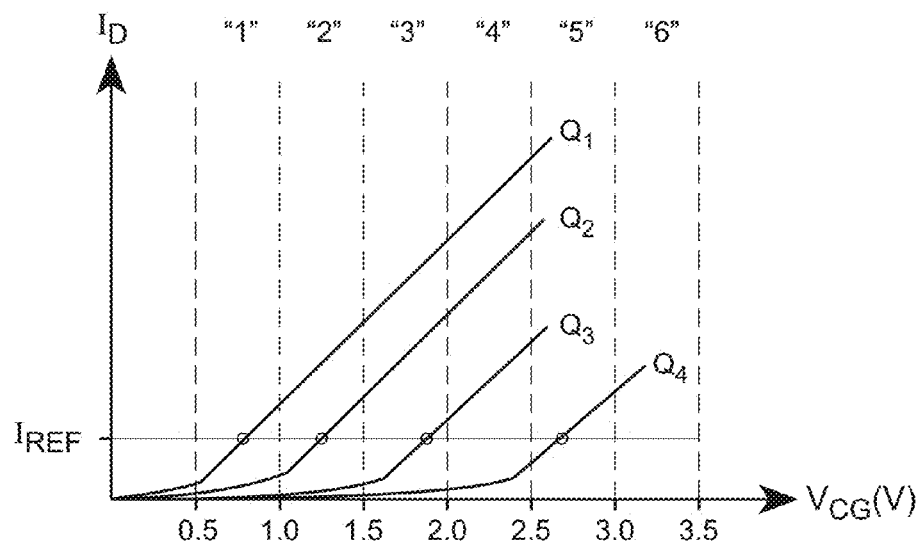
FIG. 4 illustrates the relation between the source-drain current and the control gate voltage for four different charges Q1-Q4 that the floating gate may be storing at any one time.
Figure 5:
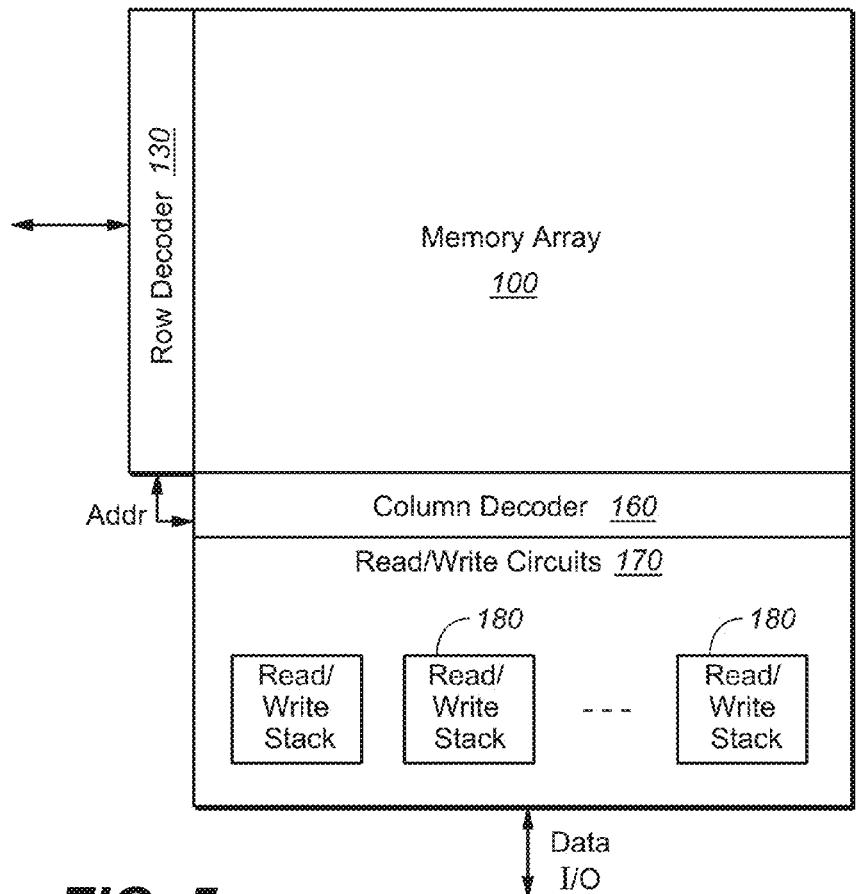
FIG. 5 illustrates schematically a typical arrangement of a memory array accessible by read/write circuits via row and column decoders.
Figure 6A:
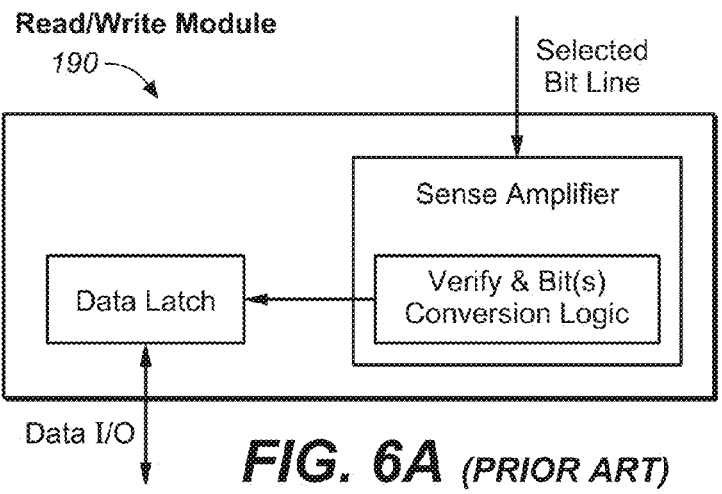
FIG. 6A is a schematic block diagram of an individual read/write module.
Figure 6B:
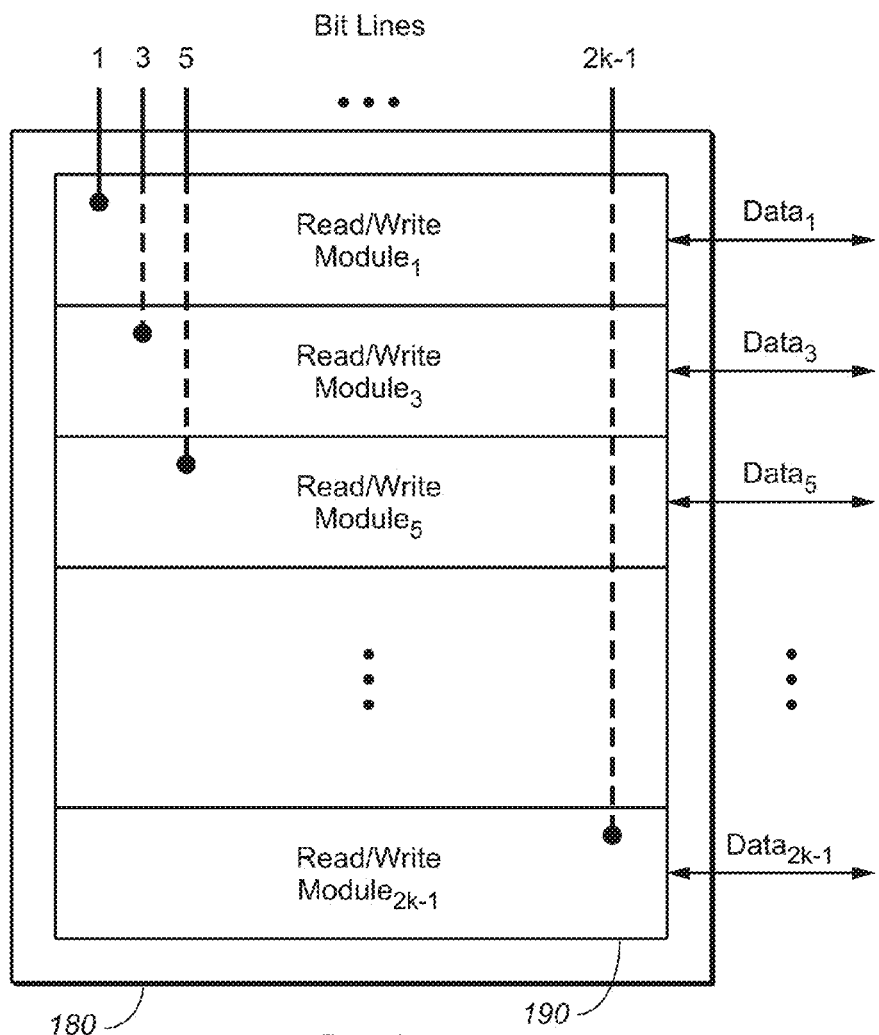
FIG. 6B shows the read/write stack of FIG. 5 implemented conventionally by a stack of read/write modules.
Figure 13:
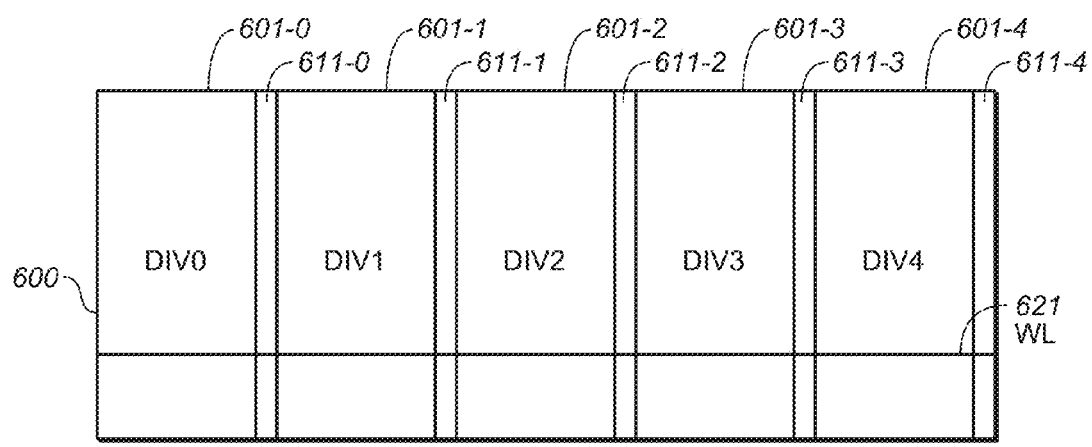
FIG. 13 illustrates the division of a memory array into divisions.

The arrangement presented in this section divides the physical columns evenly into a number of sub-divisions, where the exemplary embodiment uses 5 such divisions. FIG. 13 shows an array 600 that is split up into five divisions, DIV0 601-0, DIV1 601-1, DIV2 601-2, DIV3 601-3, DIV4 601-4. Note that the array 600 corresponds to a single array, such as 100 in FIG. 5 or 300 in FIGS. 7A and 7B, rather separate arrays, so that the word lines of the array (such as WL 621) span all of the divisions. Each division 601-$i$ includes a number of spare columns 611-$i$. The number of columns as seen from the controller (the number of columns corresponding to logical addresses) is the number outside of the spare sections, where the spares are used as described below as replacements for defective columns. The divisions all here taken to all have the same number of columns, although in some embodiments, depending on the total number of columns in the space and the number of division chosen, these size of the division may differ somewhat.

In the exemplary embodiment, each column has one word or two bytes. An example of column data arrangement shown in FIG. 14. The consecutive logic data will be evenly distributed into five divisions, so that data will be accessed from one division to the next one and cycled back. (FIG. 14 is for the case when no columns are skipped, which will be discussed further down.) As shown in FIG. 14, the first word (Bytes 0,1) are loaded into the first column of DIV0 by the corresponding access circuitry BYCOM0. Then next word is then loaded into the first column of DIV1, and so on until the last column of DIV4 are loaded (here, Bytes 578, 579 by BYCOM56). The process then starts over with the next word (Bytes 580, 581) at DIV0 with BYCOM0. In the exemplary embodiment, this distribution of data across the divisions is performed on the memory and is transparent to the controller. It should again be noted that the number of columns, divisions, and so on can varying according to the embodiment, with the exemplary embodiment just one case.

Figure 15:
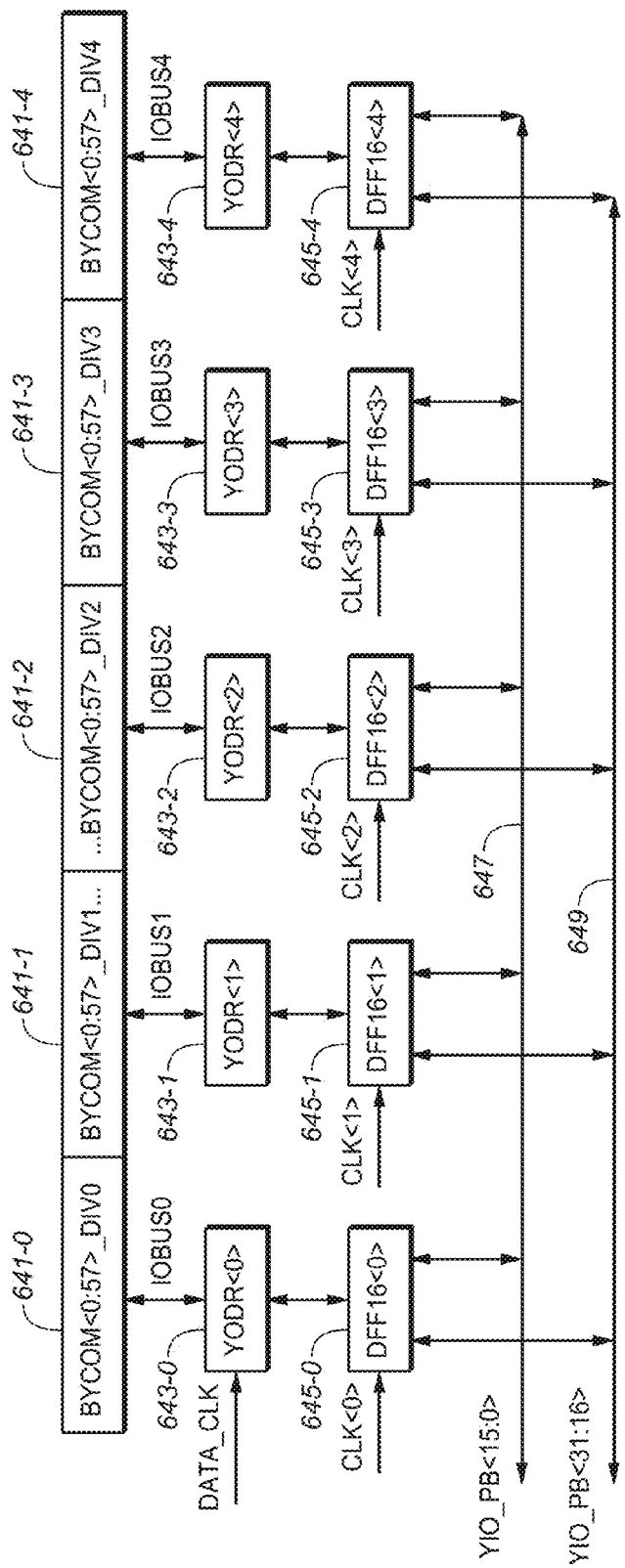
FIG. 15 is a schematic representation of some of the peripheral circuitry for distributing the data across the arrays.

FIG. 15 is a schematic representation of some of the peripheral circuitry involved in this process. One or, for increased speed, more data busses are connected to transfer data to and from the column circuit. The example uses two busses, YIO_PB<15:0> 647 and YIO_PB<31:16>, each a word wide that is connected to the peripheral circuitry, where they can be independently accessed by each of the latches of DFF16<0> 645-0 to DFF16<4> 645-4 by controlling their clock signals CLK<0> to CLK<4>. The word of data from each of 645-$i$ is then respectively transferred to latches YODR<i> 643-$i$, each controlled by the data clock DATA_CLK. The words of data are then transferred along6 IOBUSi compiled in the group of latches BYCOM 641-$i$ for the columns each of division DIVi, from where they are then transferred on to the sense amp circuitry (not shown in FIG. 15, see FIG. 8 or 9 above) on the other side of 641-$i$. In the case of a read operation, the transfer would be in the opposite direction from that just described for a write operation.

A division is only selected when its corresponding clock goes high (CLK<i> for division i). If there is no bad column in the array, the clocks will run consecutively from Div0 to Div4 and repeat. An example of user clock and internal divisions' individual clock's timing relationship shows in FIG. 16 when there is no failure in the array. Across the top of FIG. 16, the user clock is shown. From this clock, the divisions' individual clocks Clk<0> to Clk<4> are then generated as show and applied to the circuitry for the corresponding columns. In this way, the words of user data are sequentially transferred of the bus or busses.

Figure 16:
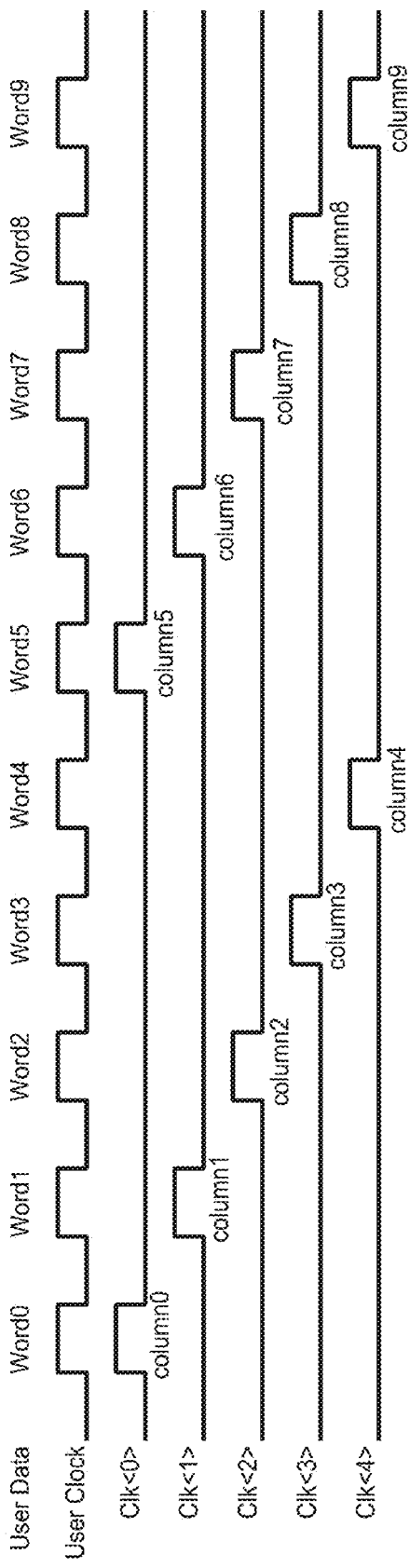
FIG. 16 illustrates user clock and internal divisions' individual clock's timing relationship when there is no failure in the array.

The arrangement shown in FIG. 16 is for the case of all of columns being good. When an internal clock's corresponding physical column is bad, that division's clock will be skipped, and instead the next division's clock will follow and put user data into that division. Effectively, the memory can skip the bad column and only access good columns, as illustrated with respect to FIG. 17.

Figure 17:
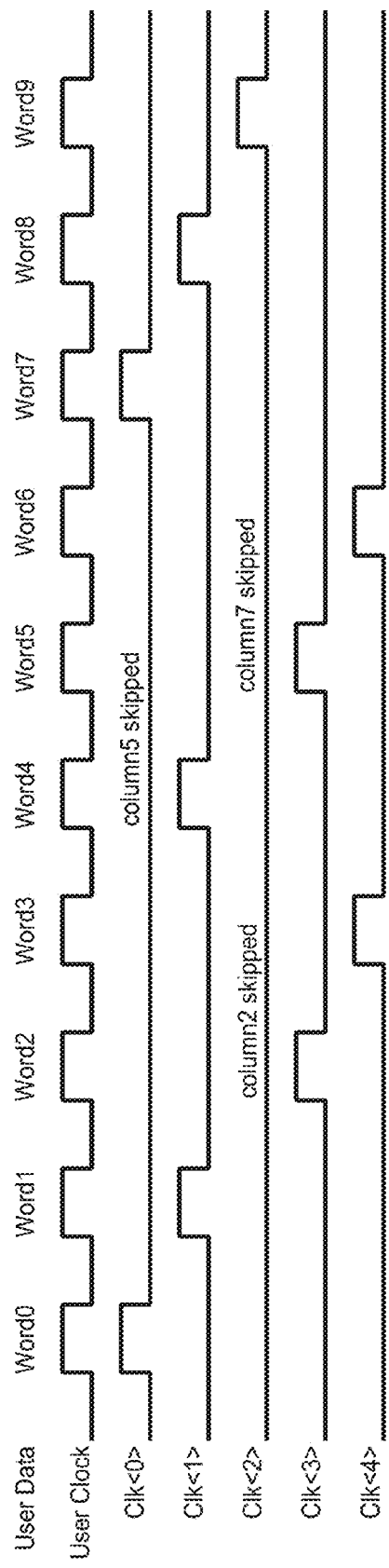
FIG. 17 illustrates user clock and internal divisions' individual clock's timing relationship when there are bad columns.

In the example of FIG. 17, physical column 2, column 5 and column 7 are bad columns, and the user only should access good columns and skips these bad columns. The clock timing scheme show is shown in FIG. 17 for this case. Column 2 belongs to division2, and when it access word2, the clock should skip division 2 and goes to division 3. Column 5 belongs to division0 is bad, and Clk<0> will be skipped and user clock goes to Clk<1>. Note that there is not a delay for the skipped columns. The process then continues on through the number of clock signals corresponding the number of columns as seen from outside of the array, with the number of bad columns being replaced by the spare columns of the areas 611-*i* of the array 600. Once this perceived total number of columns is reached, the process continues on, starting over at the first (good) column.

Figure 18:
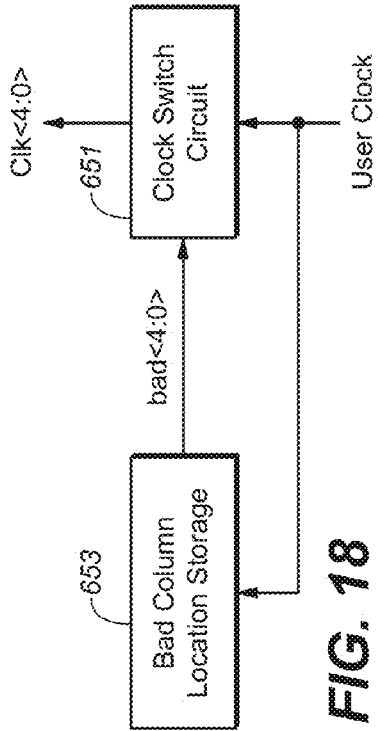
FIG. 18 is a block diagram of the circuitry for generating the individual clock signals for the divisions.

The listing of bad column addresses can be stored outside of the peripheral circuit in non-volatile memory, such as in a fusible ROM or even the memory array itself, depending on the embodiment. In the exemplary embodiment, the bad columns are determined and set at test time, such as part of a built in self-test (BIST) process, although other embodiments could subsequently update the listing. FIG. 18 shows a block level diagram for the storage and clock switch circuit. During operation, the listing of bad columns can be stored be read into the a volatile random access memory 653 on the clock switch circuit that can supply the bad<4:0>5 bit bus to the clock switch circuit 651 so that the user clock can be routed to different division clocks based on the bad column information.

Using this arrangement, the memory circuit can use the bad columns addresses to take the user clock inputs and generate the individual clocks for the different divisions. This allows the memory circuit to automatically skip bad columns and access only the good columns for user data, without the need to assign spare columns like conventional scheme and without impacting performance by bad columns. The arrangements of this section are developed further in U.S. patent application Ser. No. 13/463,422.

Variable Rate Parallel to Serial Shift Registers

The preceding discussion has looked at ways of transferring data to and from a non-volatile memory that can have defective columns that need to be skipped. In a read operation, this mean that data is retrieved from the array in a parallel format before being sent out on a data bus in serial formant. In a write operation, the data comes in serially on the bus and then is transferred to the column latches in parallel. Consequently, the read and write operations respectively use parallel-to-serial and serial-to-parallel data shift registers; and, due to the need to skip bad columns, in both cases these are shift registers of variable rate. The next section considers the case of variable rate serial to parallel shift registers further, while this section looks at the parallel to serial case. Specifically, this section looks techniques involving borrow data to reduce worst case timing in variable rate parallel to serial shift registers. A subsequent section will relate both of these cases back to the memory array structures described above.

Figure 19:
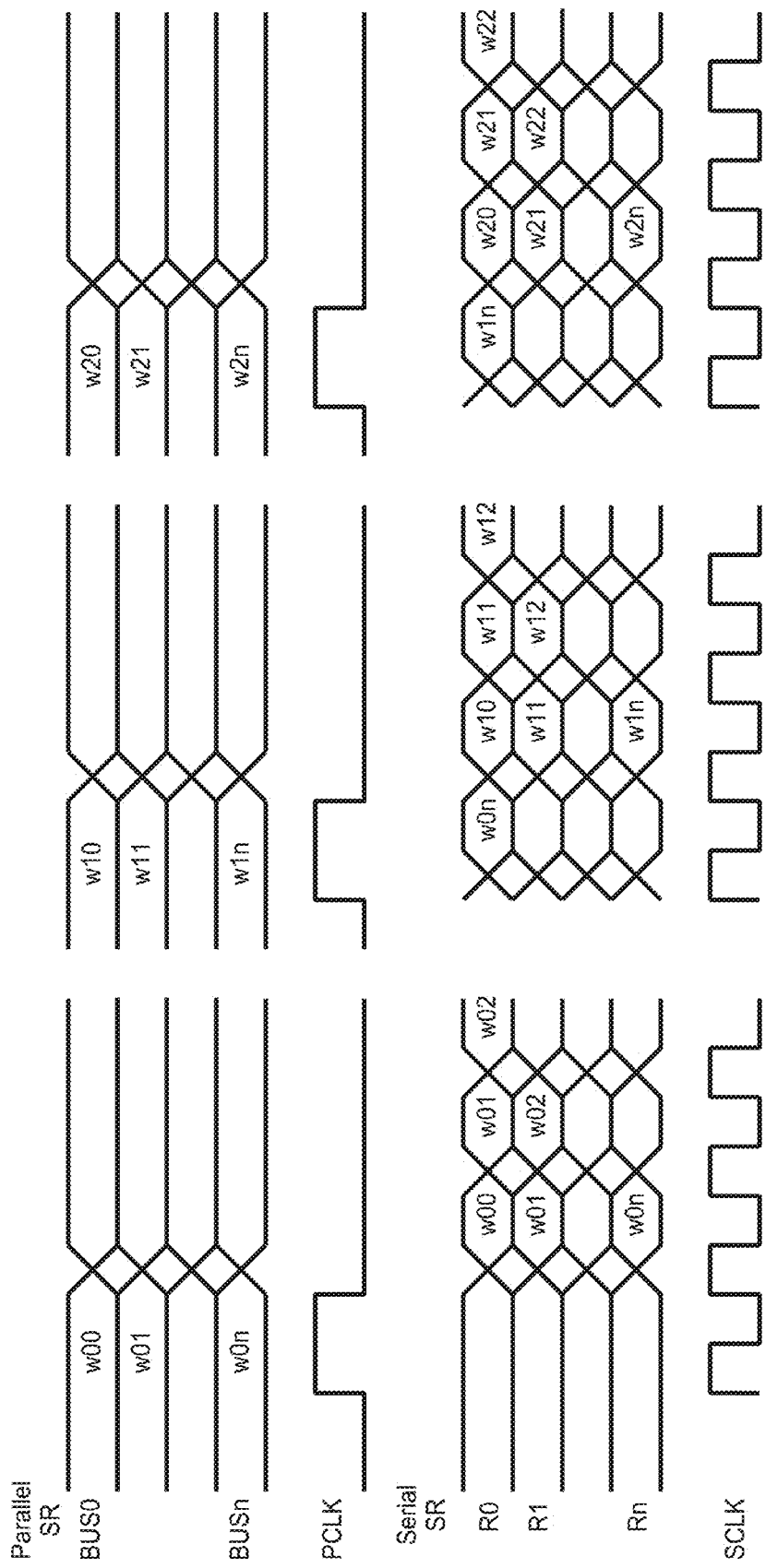
FIGS. 19 and 20 are sets of waveforms respectively illustrating an N to 1 and 4 to 1 parallel to serial shift register.

FIG. 19 illustrates the general situation of data coming in on an n+1 bit wide data bus and going out on a serial bus. For such a parallel to serial shift register, this can be implemented as two shift registers: a parallel shift register on the wider bus with a slower clock (PCLK) frequency, and a serial shift register for the narrower bus with a higher clock (SCLK) frequency. (More generally, this applies to an (n+1)×m-wide parallel to m-wide serial case.) As shown at top, the parallel bus lines BUS0-BUSn are transferred from the parallel shift register (SR) to an (n+1) bit wide serial shift register with the PCLK, with the next (n+1) bits on the parallel bus then being loaded onto the parallel SR. Thus, as shown in FIG. 19, initially the bits w00-w0n are in the parallel SR and, when PCLK goes high, transfer over to the serial SR, with the bits of w10-w1n ten loading into the parallel SR. Here the notation "w" is used as are more generally m-bit words, for some integer m. The contents of serial SR elements R0-Rn are then sequentially shifted up to the next register slot and, from R0, on to the serial bus based on SCLK. If no skipped entries, there are then n+1 SCLKs for each PCLK. As shown, this process continues on as the data comes in on the parallel bus. The example of the n=3 case of 4-to-1 parallel to serial conversion is shown in FIG. 20.

In a variable rate parallel to serial shift register, there are some locations in the parallel shift register that are to be skipped. For instance, this would be the case for bad columns when the parallel data is being read out an array such as in the preceding section. As the serial clock shifts data out of the serial SR at a steady rate, the parallel clock will need to load in another set of data into the parallel SR sooner. Consequently, the PCLK period is not a fixed cycle, with the PCLK period depending of the number of skipped entries in the previous cycle. Each unit of the serial shift register needs to have a bypass function if it load data that is to be skipped from the parallel shift register. An example of this is illustrated in FIG. 21.

Figure 20:
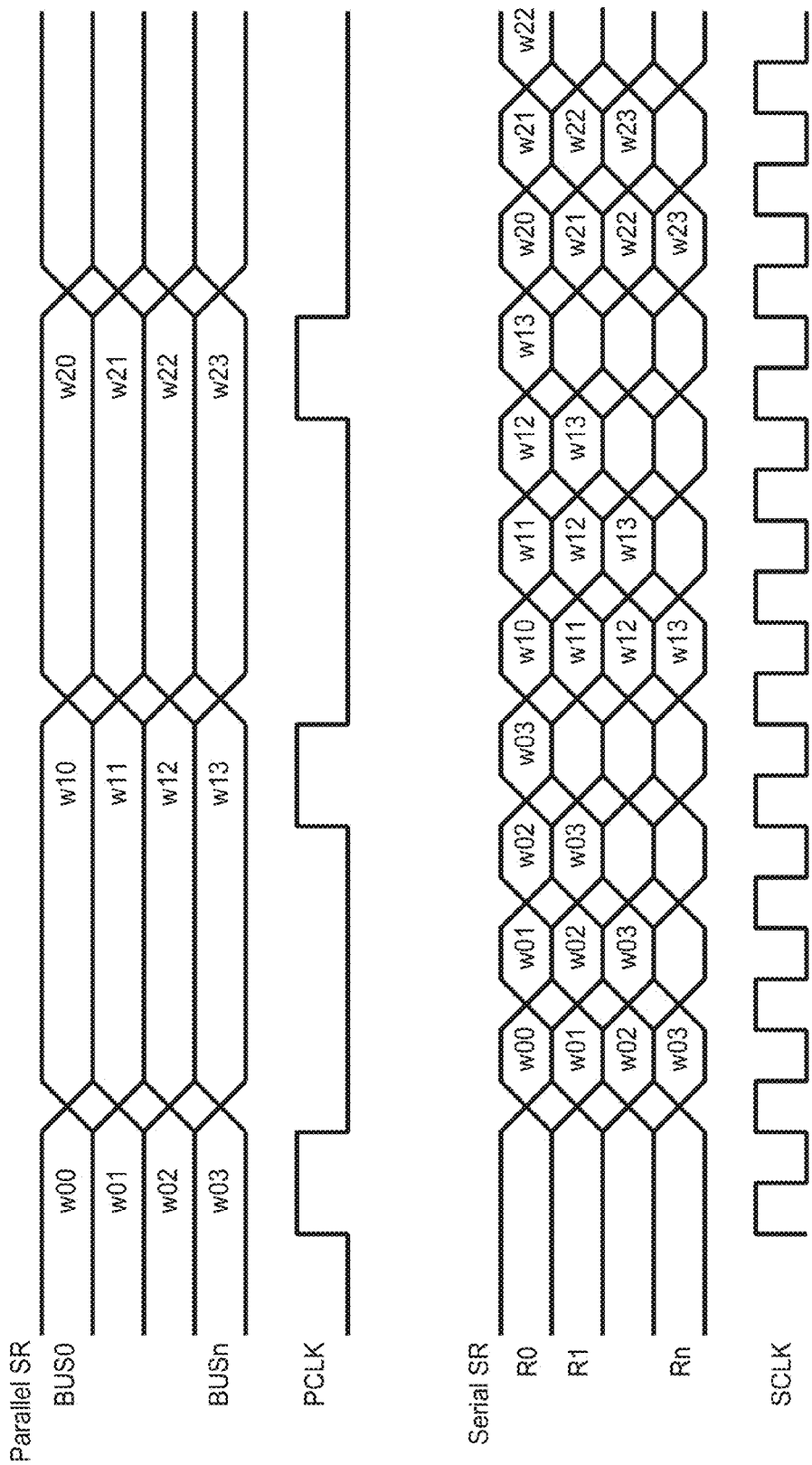
Figure 21:
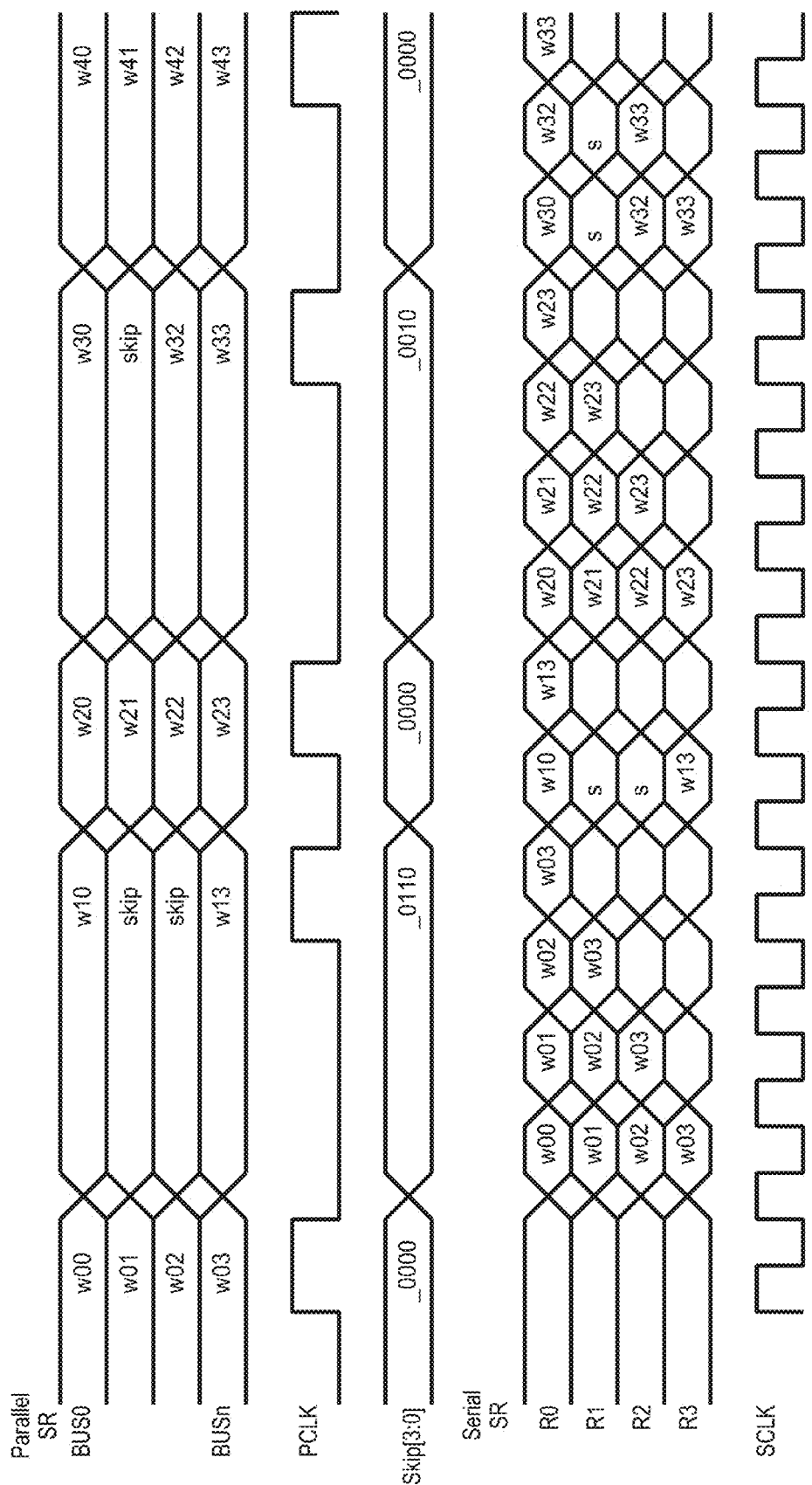
FIG. 21 is a set of waveforms illustrating a 4 to 1 variable rate parallel to serial shift register where the parallel data may include skipped data.

FIG. 21 begins as in FIG. 20, as there are no skipped entries in the first set of data, as indicated by Skip[3:0] having all 0s. The next set of bits loading into the parallel SR has two entries that are to be skipped, where, as indicated by the 1s in the middle of Skip[3:0], these are on from BUS1 and BUS2 and are represented as "skip". At the second PCLK, these values are loaded into the serial SR, where the middle two elements to be skipped are represented as "s". At the first subsequent SCLK, the R0 entry is transferred out on to the serial bus and, due to the two entries to skip in R1 and R2, the R3 entry of w13 needs to be shifted across to R0, skipping R1 and R2. In the next SCLK, the R0 entry of w13 is then shifted out on to the serial bus. In this way, there are no gaps for the skipped items and the process can appear transparent as seen from the serial bus. As all of the valid entries have now been shifted out of the serial shift register, the next PCLK signal is then needed to shift the next data from the parallel SR to the serial SR. Note that as there were only 2 valid data entries, rather than 4, the corresponding PCLK cycle is only 2 SCLK cycles long, rather than being 4 cycles in duration. The process continues, with another skipped entry off of BUS1 two PCLKs later.

The skipped entries will increase the amount of gate delay and signal travel distance in one SCLK cycle. For example, in FIG. 21 when the R0 entry is w10, the R3 entry is w13, and the R1 and R2 entries are both to be skipped, during the single SCLK cycle in which w10 is transferred out of R0, w13 also needs to be transferred all the way from R3 to R0. This sort of gate delay and signal travel distance can become a performance bottleneck if the SCLK period is shortened.

Under the arrangement of FIGS. 20 and 21, each element Ri of the serial shift register receives data only from BUSi: for example, w00 goes from BUS0 to R0, w01 from BUS1 to R1, and so on. According to a principle aspect of this section, the data refresh cycle data path is modified so that the serial shift register elements can conditionally update from other BUS elements. For example, in the exemplary embodiment, Ri can conditionally update from BUS(i+1). This is illustrated in FIG. 22.

Figure 22:
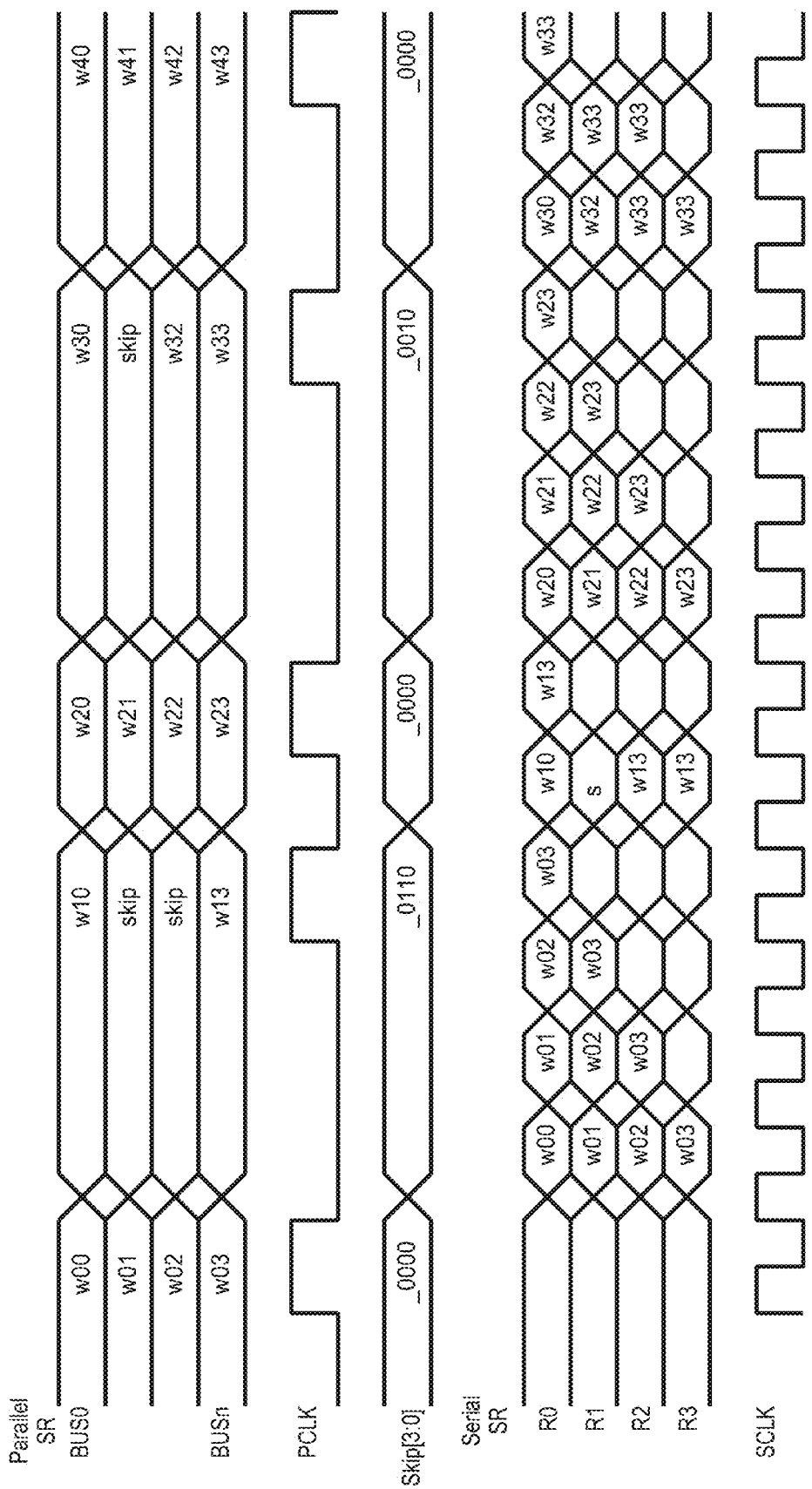
FIG. 22 is a set of waveforms illustrating a 4 to 1 variable rate parallel to serial shift register with borrow data for included skipped data.

FIG. 22 corresponds to the same incoming data, Parallel SR-BUS transfers, PCLK, and Skip[3:0] traces as in FIG. 21. Now, however, during the data refresh cycle when data is transferred from the parallel shift register to the serial shift register, BUS3 data can transfer to R3 or R2, BUS2 data can transfer to R2 or R1, and BUS1 data can transfer to R1 or R0. Thus, at the second shown PCLK clock, the w13 data is transferred into R2 as well as R3. Consequently, when w10 is shifted out on to the serial bus, w13 only needs to skip one unit in the serial shift register, from R2 to R0, instead of two units from R3 to R0. If there is only a single element to be skipped, as at the fourth shown clock signal, no serial SR units need be skipped, as where w33 is loaded into R2 as well as R3. Consequently, by loading data from BUS(i+1) to Ri, the maximum number of skipped units in the serial shift register is reduced by 1.

Figure 23:
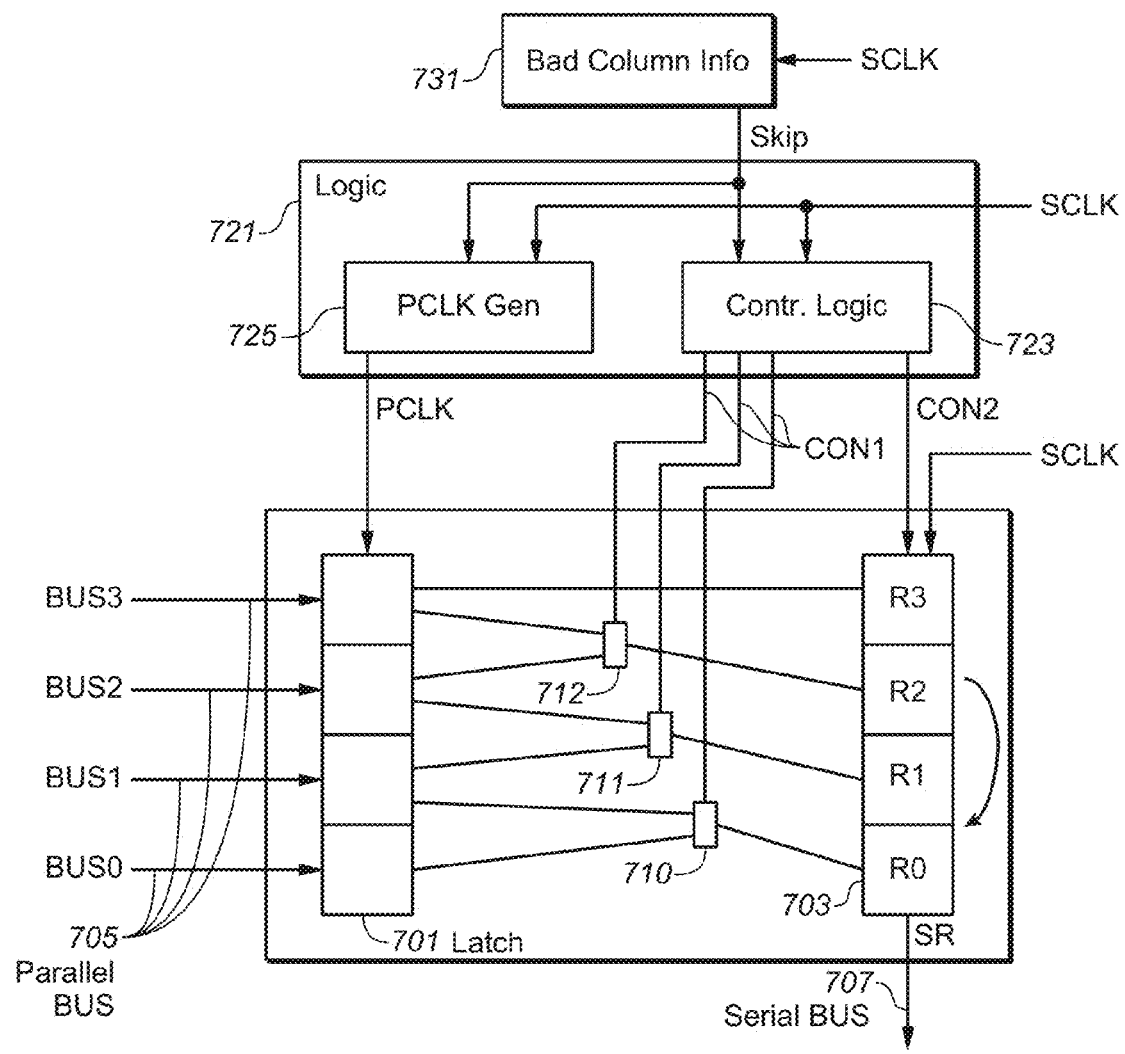
FIG. 23 is a box diagram exemplifying some circuitry to carry out the process illustrated in FIG. 22.

FIG. 23 is a block diagram to illustrate some exemplary circuit elements to implement this process. The parallel data bus 705 feeds into the parallel shift register or latch 701, which receives the clock signal PCLK that controls when one set of contents from the latch 701 is moved to the serial shift register 703 and the next set of data is loaded in off of the parallel bus. The contents of the serial shift register SR 703 are then sequentially shifted out onto the serial bus 707 according to the clock SCLK. The set of multiplex circuits 710, 711, 712 allow for more than one element of the latch 701 to be selectively transferred to the elements of the serial shift register. Here, MUX 710 allows for either BUS0 or BUS1 data to be transferred to R0, MUX 711 allows either BUS1 or BUS2 data to go to R1, and MUX 712 allows either BUS 3 or BUS 2 data to go to R2.

To generate the PCLK and control signals to bring this about, so logic is needed and is represented at Logic 721. For the example of a non-volatile memory array, this would again be part of the peripheral and decoding circuitry for the array. The relevant parts for the discussion here include a PCLK generation circuit 725 that receives the serial clock SCLK and the Skip data and then generates PCLK as a multiple of SLCK, where the multiple is the number of entries in 701 that are not to be skipped. The Skip data comes from the memory 731 and in the example of a column based memory array would be the bad column location storage, similar to element 653 in FIG. 18. The MUXs 710, 711, 712 receive the control signals CON1 from the control generation logic 723 and are again determined based on the Skip information and SCLK.

In this exemplary embodiment, the MUXs are arranged so that an element of SR 703 can receive refresh data from one of, at most, two different BUS data; for example, R1 can receive BUS1 or BUS2, but not BUS3. Consequently, this arrangement reduces the maximum skip needed in the serial shift register by 1. In other embodiments, the arrangement to be set up so to allow more general transfers to further reduce number of skipped elements. This largely a design choice, since a more general MUX arrangement adds complexity to this part of the circuit, but reduces the amount of circuitry needed to skip units of the serial shift register. This decision can be based on how frequently skips are expected. In this case, more than one skip per set of data coming in on the serial bus 705 are infrequent enough that the reducing the maximum skip by 1 is considered a good compromise between increased MUX complexity and serial SR skips. Consequently, although the amount of need skips are reduced, in this embodiment the serial shift register 703 will still need the ability to skip units. This was seen in FIG. 22 for the case when both the BUS1 and BUS2 needed to be skipped. This is represented by the arrow to the right of SR 703 and the control signal generation logic circuitry 723 can again supply this signals CON2 based on the Skip data.

For any embodiment employing this technique, by reducing the maximum skip distance in the serial shift register, amount of gate delay and signal travel distance is shortened, reducing or even eliminating the timing bottleneck in the serial SR so higher speed can be achieved.

Serial to Parallel Shift Register

This section looks at the serial to parallel transition, where the latches are closed in a sort of "sliding door" arrangement for fixed or variable rate serial to parallel shift registers. The aspects described in the section can reduce the number of high speed signals need in serial to parallel circuits.

Figure 24:
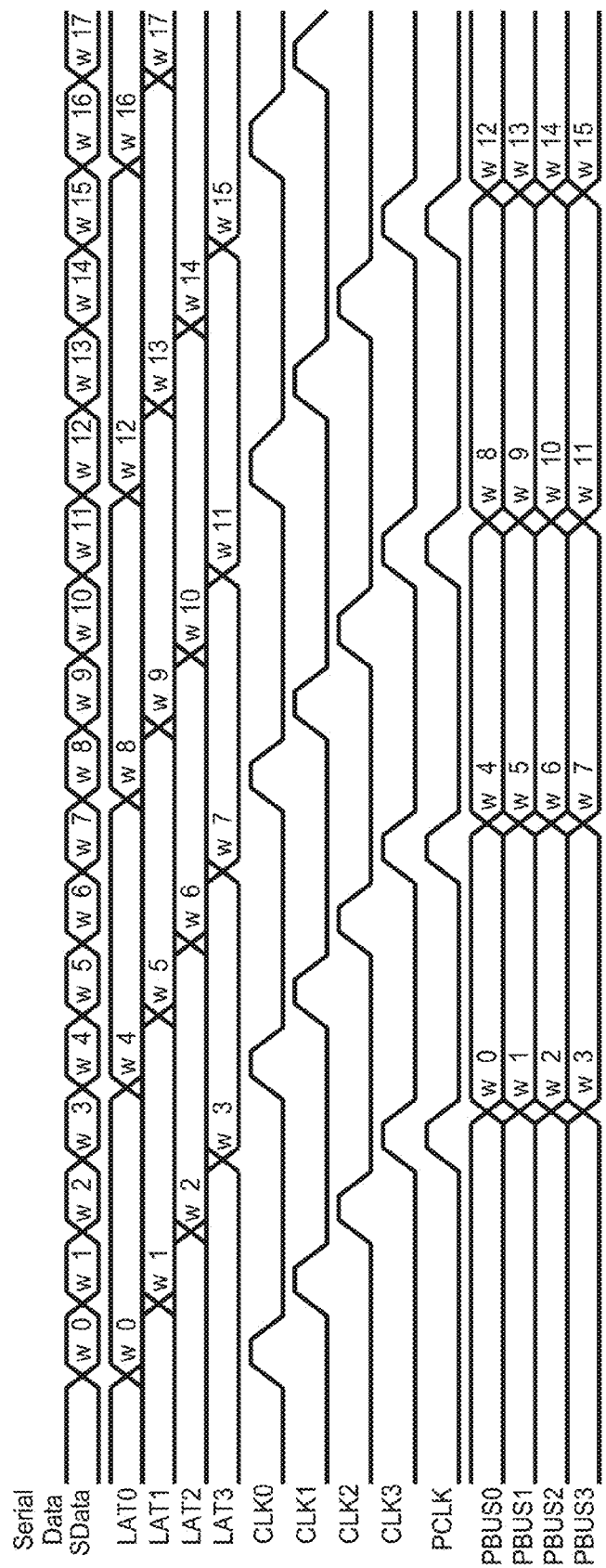
FIGS. 24 and 25 are sets of waveforms respectively illustrating 1 to 4 serial to parallel shift register respectively with and with variable rate.

FIG. 24 looks at a serial to parallel, 1 to N conversion, where there is 1 data in port and N parallel latches where each of the latches has a clock to latch the data at different time. Here N=4 and the serial data trace at top and the individual clocks CLK0-CLK3 are such as those described in FIG. 16 above for an N=5 case. The bits, or more generally multi-bit words, come in on the serial bus SBUS as serial data and are sequentially loaded in the latches LAT0-LAT3 according to the clocks CLK0-CLK3. Once all of the latch units are loaded, PCLK goes high and the data is shifter out on to the parallel data bus. When, as in FIG. 24, none of the data being loaded on the data bus is to be skipped, the parallel clock PCLK is the same as CLK3.

Figure 25:
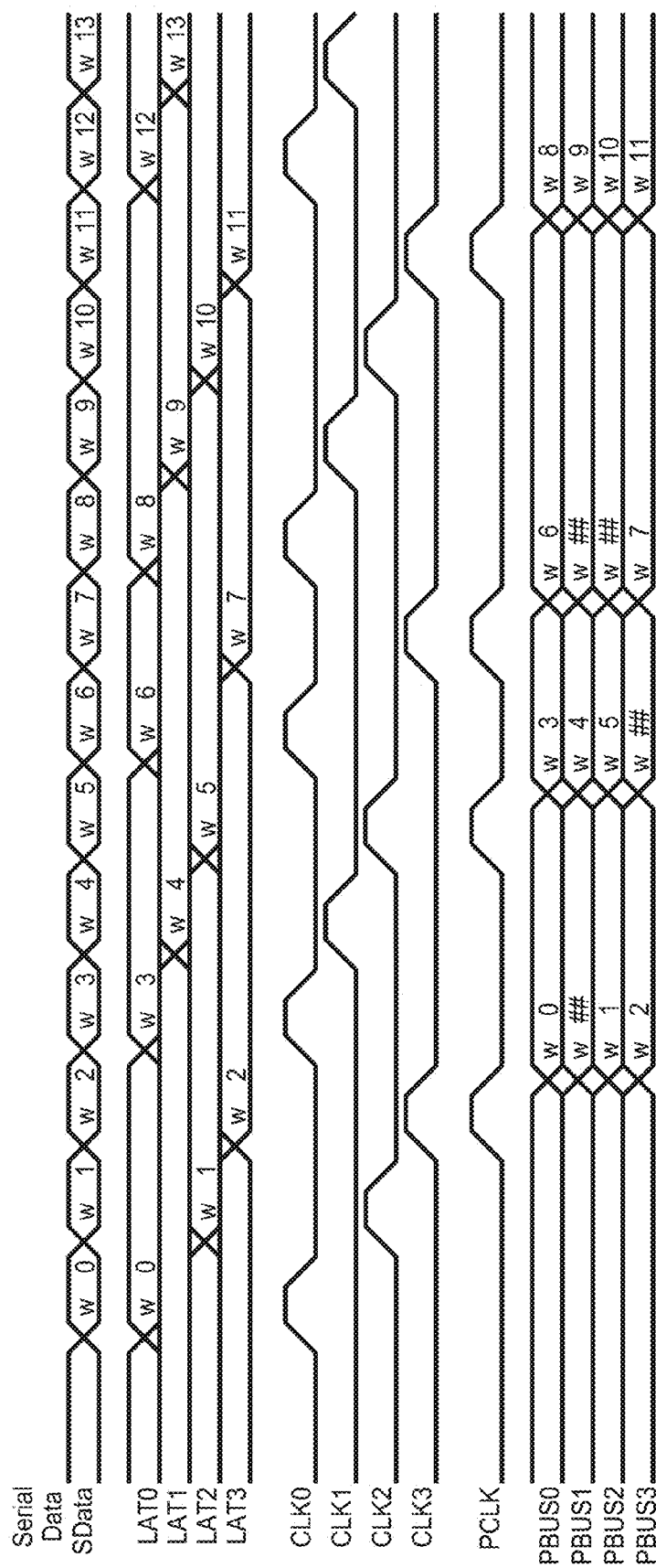

FIG. 25 looks at the case where data is to be skipped, the situation being reversed from the parallel to serial case of the last section. Here, the data comes in on the serial bus with every clock and no gaps or skips, but when loaded on to the parallel bus there may be locations that are to be skipped. Again, the idea is that as seen from outside on the serial bus, any data to be skipped on the parallel bus is largely taken care of internally. In the exemplary embodiments, the skipped locations again correspond to bad columns of a non-volatile memory array and any skips are taken care of on the memory chip in a manner transparent to the controller so that the data being transferred serially between a memory chip and controller has any skips for bad columns already edited out.

In FIG. 25, an example of an N=4 serial to parallel conversion for a variable rate, serial to parallel latch arrangement where some of the CLK signals are skipped. The arrangement is similar to that described above with respect FIG. 17 for the N=5 case. As the serial data bit (or m-bit words) w0, w1, . . . come in on the serial bus SDATA one after another, they are again loaded into the latch elements LAT0-LAT3 based upon the CLK0-CLK3 signals. Now however, when an element to be sent to the PBUS is to be skipped the corresponding CLK signal is skipped. Thus, the first CLK1 signal is skipped in the first set of CLKs and the CLK3 skipped in the second. The data of skipped location in the parallel bus is "don't care", indicated by "##". Once the contents of the latch that are not to be ignored are all in, they are then shifted out onto the parallel bus based on PCLK.

In this arrangement, the input boundary signals are SDATA, CLK0~3 and PCLK in this example. Consequently, there are many high speed clocks with low duty cycle that need to be provided to the latch structures. This will require more routing space on the system to avoid any degradation that otherwise occur for the clock pulse shape. The generation of the CLK0~N signals depends on how many skip location allowed in one parallel cycle, where the more allowed skips, the more cases that need to be considered in the design. Rather than trying to generate the many different clock signals for each of the latches, the exemplary embodiment here makes each latch clock to default open and to close only when needed. This illustrated in FIG. 26.

Figure 26:
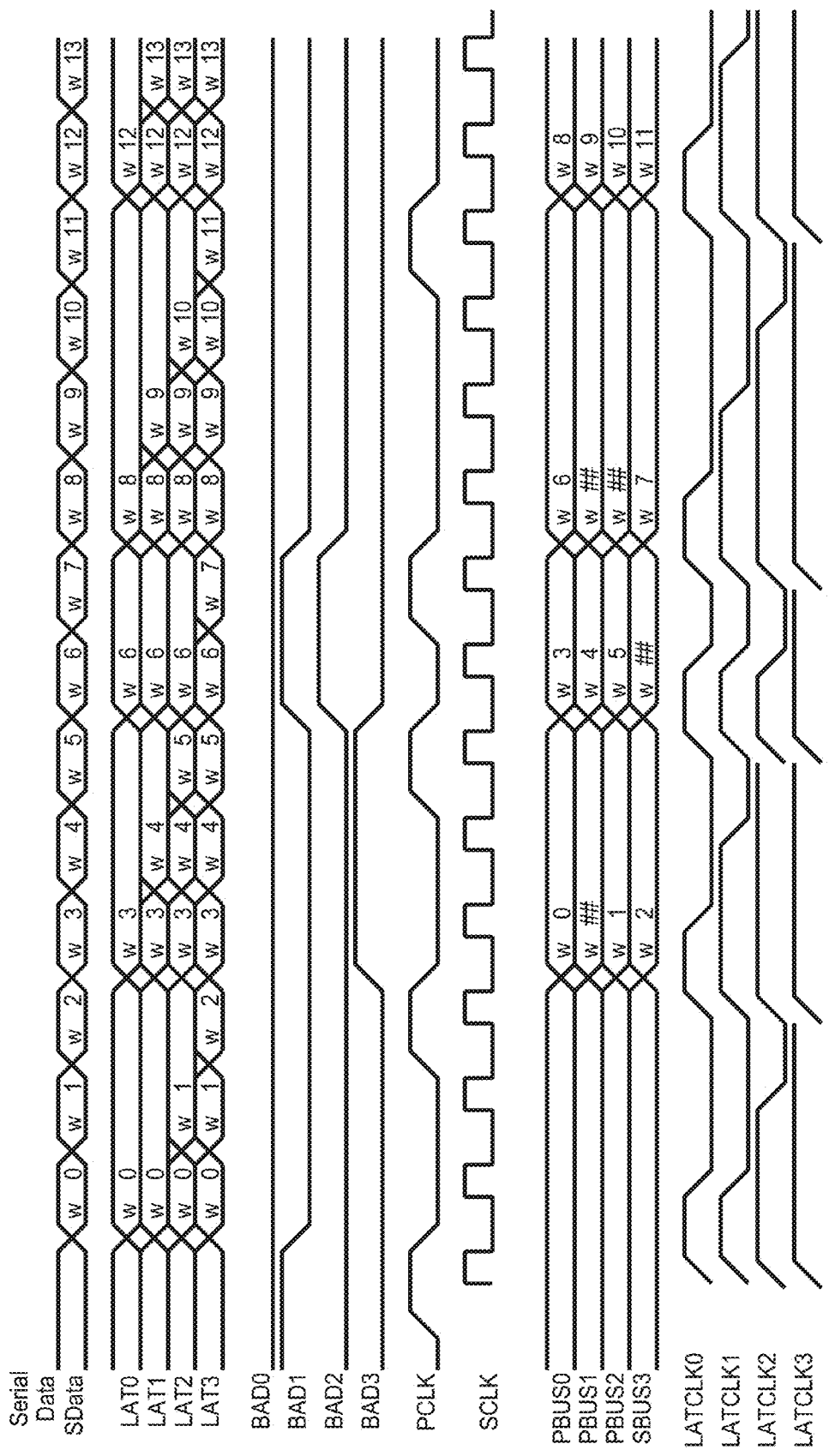
FIG. 26 are sets of waveforms illustrating 1 to 4 variable rate serial to parallel shift register using a "sliding door" sort of arrangement for closing latches.

FIG. 26 is an exemplary N=4 embodiment. The input boundary signals are the serial data SDATA, the indication BAD0~3 of which elements of the parallel bus are to be skipped, the parallel clock PCLK for transfer the latched data out to the parallel bus, and the clock SCLK. The high speed signals are reduced to only the single input of SCLK.

In FIG. 26, at top the bits, or more generally m-bit words, w0, w1, . . . of serial data again come in on the serial data bus. The serial or user clock is shown at SCLK. The latches elements LAT0~3 are loaded according to the locally generated LATCLK signals. Each LATCLK will set to open at PCLK high cycle, and will sequentially close when LAT-CLK(n−1) goes low. The BAD signals indicate which latch elements are to be ignored in the next set to load on to the PBUS; for example, at the beginning BAD1 is high indicating PBUS1 is to be ignored, with w1 instead going to PBUS 2. Similarly, when BAD3 is later high, w6 in not loaded to PBUS3 but PBUS0 at the next refresh. (The BAD information is one cycle early so that the current LATCLK can know how to behave after the update (PCLK) cycle.) The memory will load the skip information at PCLK falling edge: if it loads a skip cycle, it will bypass the previous LATCLK to its next unit.

Consequently, as shown at the first falling PCLK, w0 is loaded at all the LAT0~3. As BAD1 is high, at the next SCLK LATCLK0 and LATCLK1 fall. w1 is then loaded at LAT 2 and LAT3, after which LATCLK 2 falls. w2 is then loaded in at LAT3. When PCLK next falls, all of LAT0~3 are loaded onto PBUS0~3. Although w0 is still in LAT1 and thus loaded onto PBUS1, this corresponds to data to be ignored (w##). Note that when the corresponding LATCLK is high, the latch is open and the SDATA will pass through the latch, with the PCLK falling edge taking a snapshot of all the latch elements and put this on the PBUS. Under this arrangement, sometimes the LATCLK2 may not close and the LAT3 is the SDATA.

In the exemplary embodiment, the 1 to 4 serial to parallel maximum skip is two, although further optimization is available to reduce the number of skips needed. In the PCLK cycle, the LATCLK0/1 may not be set to 1. If BAD0 is high, LATCLK0 will not set to 1. If BAD0/1 are both high, LATCLK0/1 will be both 0 after PCLK cycle. This will reduce 30% of the skip cases.

Figure 27:
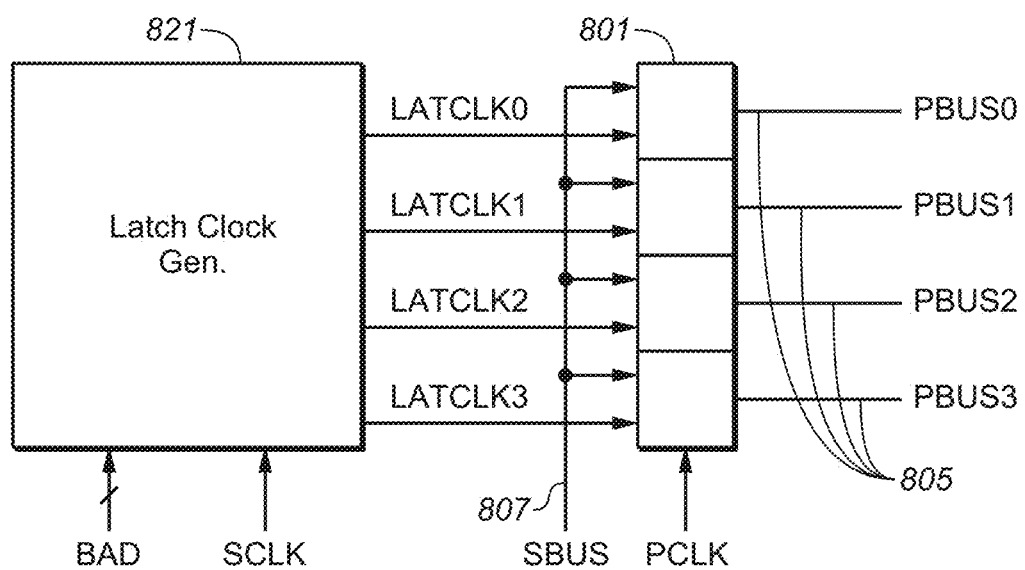
FIG. 27 is a box diagram exemplifying some circuitry to carry out the process illustrated in FIG. 26.

FIG. 27 is a block diagram to illustrate some exemplary circuit elements to implement this process. Again, the exemplary embodiment is for N=4. The latch 801 transfers data out onto the PBUS 805 based on the PCLK. The PCLK signal can generated similarly to that of the preceding section, as a multiple of the SCLK, the multiple being the number of elements that are not to be skipped (or, in this example, 4 minus the number of skipped entries going out on PBUS 805). The next set of data is then loaded in off the serial bus 807, starting with all of the latches open, but then being closed in the sort of sliding door manner described with respect to FIG. 26, with the latches being sequentially closed based upon the LATCLK signal going low. The LATCLK signals are generated by some logic, represented by box 821, based upon the SCLK and the BAD data that indicates which entries on PBUS to skip. The BAD data is again imported from a memory to hold this information. In the exemplary embodiment, this could again correspond to bad columns, as is discussed further in the next section. Of the inputs to FIG. 27, the number of high speed signals requirement in serial to parallel circuit is reduced to just SCLK.

Memory Array Access with Bad Column Information

Figure 28:
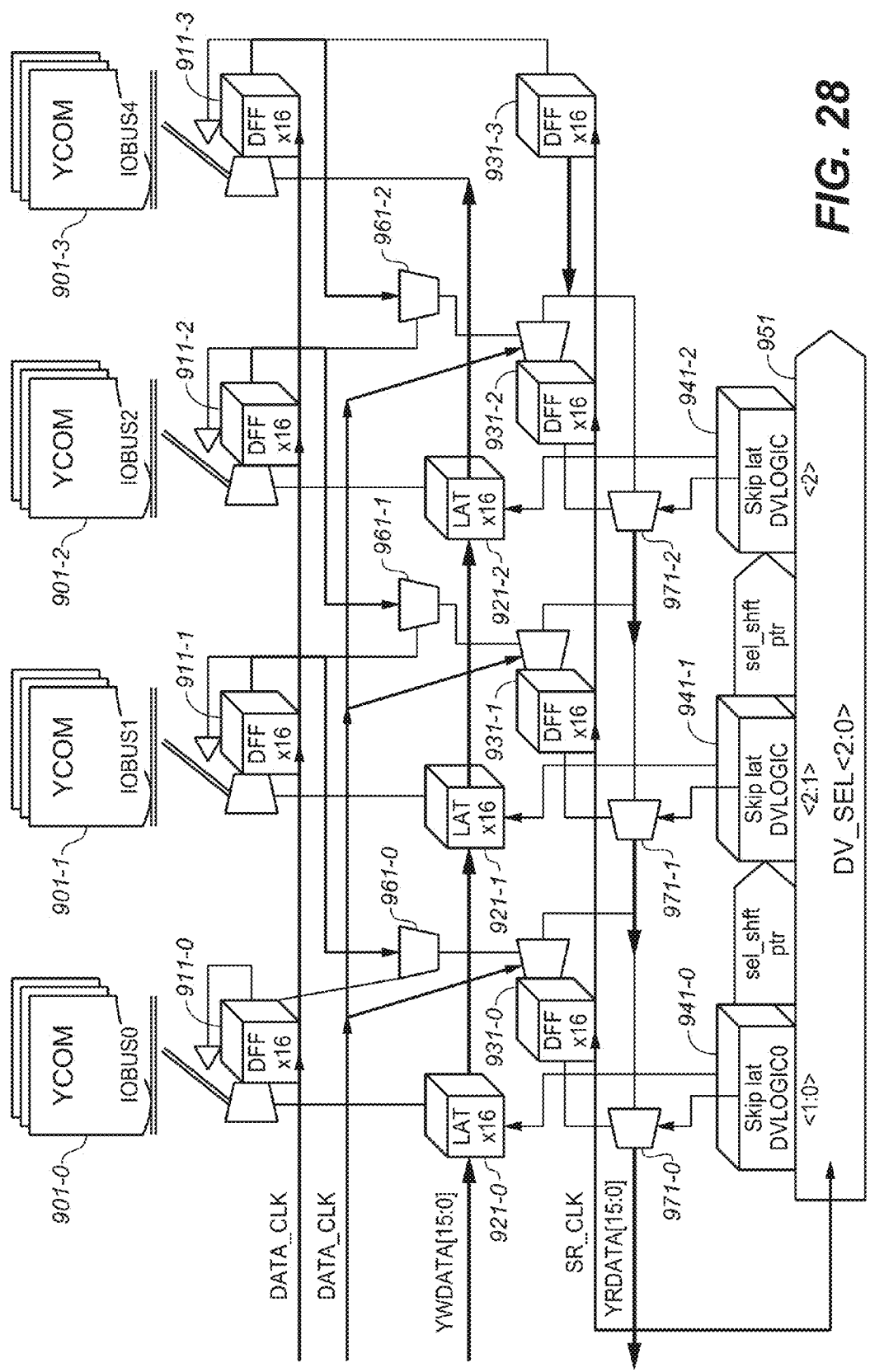
FIGS. 28-30 place the circuitry of FIGS. 23 and 27 in the context of non-volatile memory with column redundancy.

This section relates the parallel-to-serial and serial-to-parallel arrangements of the last two sections back to their use in transferring data from and to a memory array that is accessed on a column basis, where some of the columns are to be ignored. In this way it is similar to the earlier sections above, but employing the techniques describer with respect to FIGS. 19-27. FIG. 28 roughly corresponds to FIG. 15 of the earlier described embodiments, but incorporated the sort of structure described with respect to FIGS. 23 and 27, as shown more explicitly in FIGS. 29 and 30, respectively.

The diagram of FIG. 28 shows the simplified core datapath, the YCOMs and IOBUSSs 901-*i* and top row of DFFs 911-*i* corresponds to the parallel shift register. The bottom row of DFFs 931-*i* corresponds to the serial shift register for transferring out read data on YRDATA, DATA_CLK corresponds to PCLK, and SR_CLK to SCLK in the previous context. The middle arrow to the MUXs 961-*i* is the borrow neighbor data path implemented by the MUXs of FIG. 23. The middle row of latches LAT 921-*i* are used in the write process for the serial to parallel conversion of the write process, where the write data YWDATA comes in a 16-bit word serial format. The control signals to effect the skips for ignore data of bad columns come from the skip logic or 941-*i* and the device select data 951.

Figure 29:
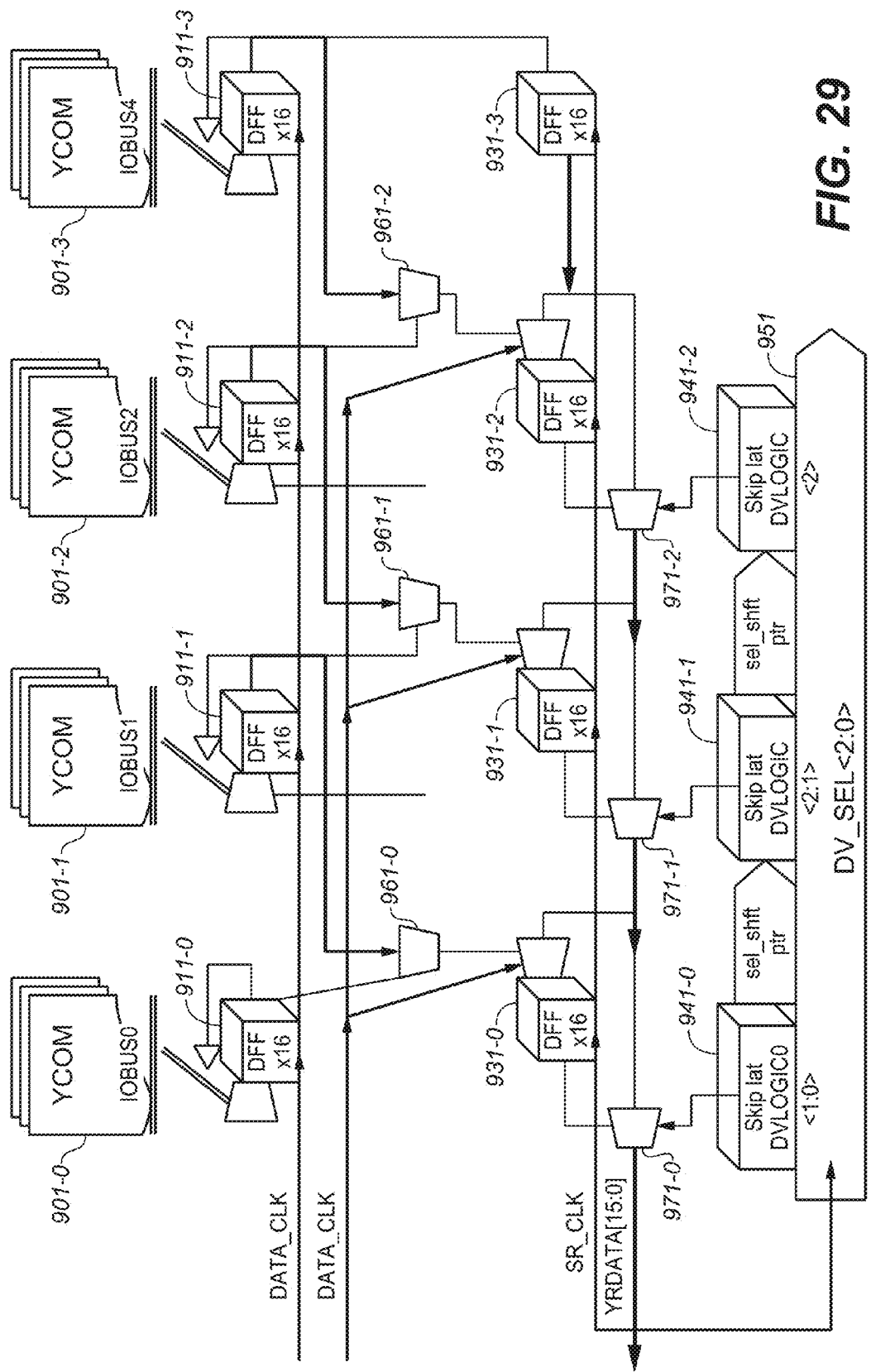
Figure 30:
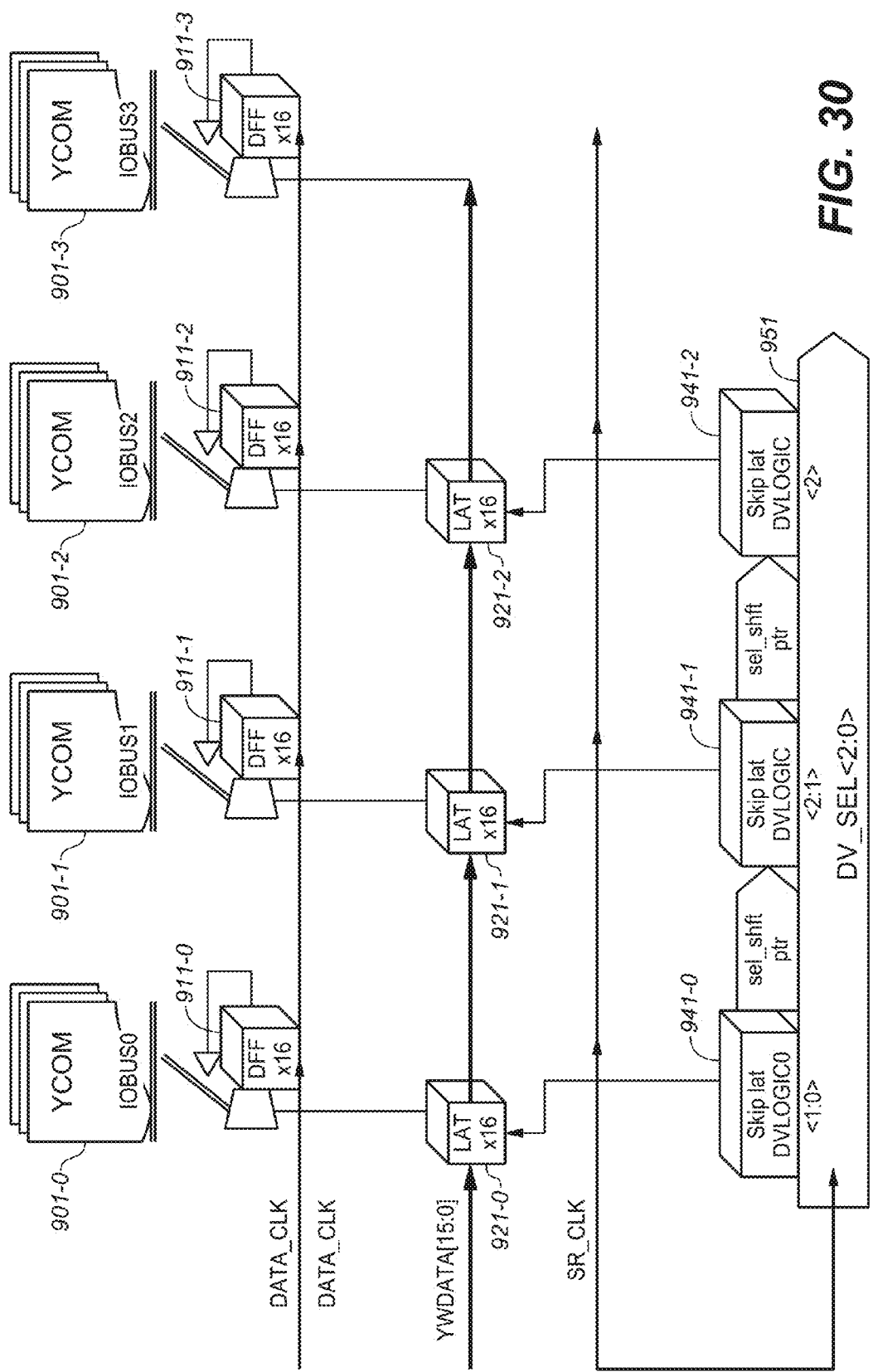

FIG. 29 shows just the parallel to serial elements of FIG. 28 that are involved in the read process, with the write-specific elements suppress to simply the diagram. The upper rows of elements, the YCOMs and IOBUSSs 901-*i* and top row of DFFs 911-*i*, correspond to 4×16 the parallel shift register. The serial shift register is then the DFFs 931-*i* across the bottom, where the elements 931-0, 931-1, and 931-2 are respectively feed by the MUXs 921-0, 921-1, 921-2 so as to reduce the number of needed skips by 1 in case of any bad column data. The elements 971-*i*, which are controlled by the logic 941-*i* and 751, provide for any additional needed skips, as this embodiment only reduces the maximum skip by 1. The read data is then shifted out on the bus YRDATA in (16-bit wide) serial format. FIG. 30 similarly illustrates the write path elements, where the (16-bit wide) serial data comes in on YWDATA, where it is latched as described above with respect to FIGS. 24-27 and shifted out in (4×16) parallel format.

The ideas of the preceding several sections are developed further in U.S. patent application Ser. Nos. 13/630,163 and 13/630,278.

Centralization of Variable Rate Serializer and Deserializer

As discussed above, data is received onto, and transferred out from, the memory chip from the bus in serial manner, where data comes in a word at a time. (Here the word is taken to be 16 bits, but may more generally be of other sizes.) Data is written into, and read out of, the memory array in pages of data, where the read and write pages are of typically of a much higher degree of parallelism. Once the data is received on the memory circuit in the above arrangements, it is distributed among read/write circuitry of the different divisions (such as 641-0 to 641-4 of FIG. 15), where it is latched, the write page assembled and then programmed. In the embodiments above, along this path the data is transformed from a (single word) serial format to a (multi-word) parallel format, such as could be accomplished with the sort of circuit illustrated above with respect to FIG. 27 and discussed with respect to it and associated figures above. Similarly, in the read process the data undergoes a (word-wise) parallel to serial format change, as discussed with respect to FIG. 23 and related figures.

In parallel format data can be transferred at a higher rate. Consequently, once the data is on the memory chip, the earlier data is converted into parallel format, the higher the rate at which data can be transferred within the memory circuit. Referring back to FIG. 28, as described above the SR_CLK line (between the 931 and 971 elements) is the serial clock signal, with the elements above (the 921, 911, and 961 elements) being used for the serial to parallel and parallel to serial conversion. Prior to these elements (closer to the chip's pins), data is in a serial format, while after them data is in a parallel format. The closer these serial to parallel and parallel to serial conversion are to the input pins, the more easily data rates can upped on the memory chip. This section looks at moving these conversions further out from the memory array.

More specifically, as in the preceding sections, a multiple column is defined as parallel group, and some of the columns in this parallel group could be bad. The parallel group will be read/write with one parallel clock cycle. The column redundant (CRD) block can generate bad column locations' information and send to control logic to control how serial data convert to parallel data. Now, however, the serialization/deserialization is moved in location and, on the parallel end, a double data rate (DDR) type of arrangement is used to further slowdown the frequency and save clock power.

Figure 31:
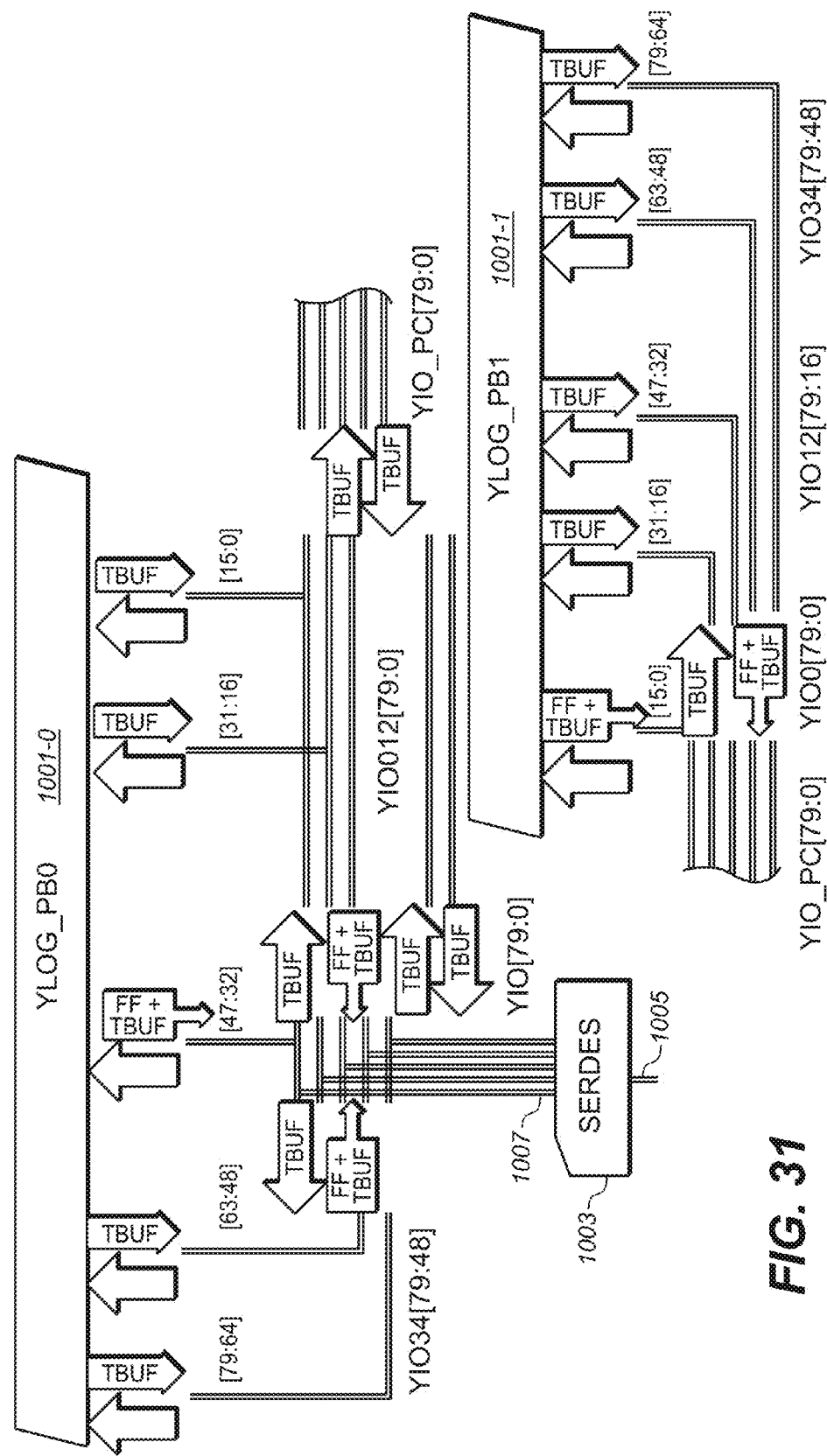
FIG. 31 is a relatively high level diagram of some of the elements of an alternate embodiment.
Figure 32:
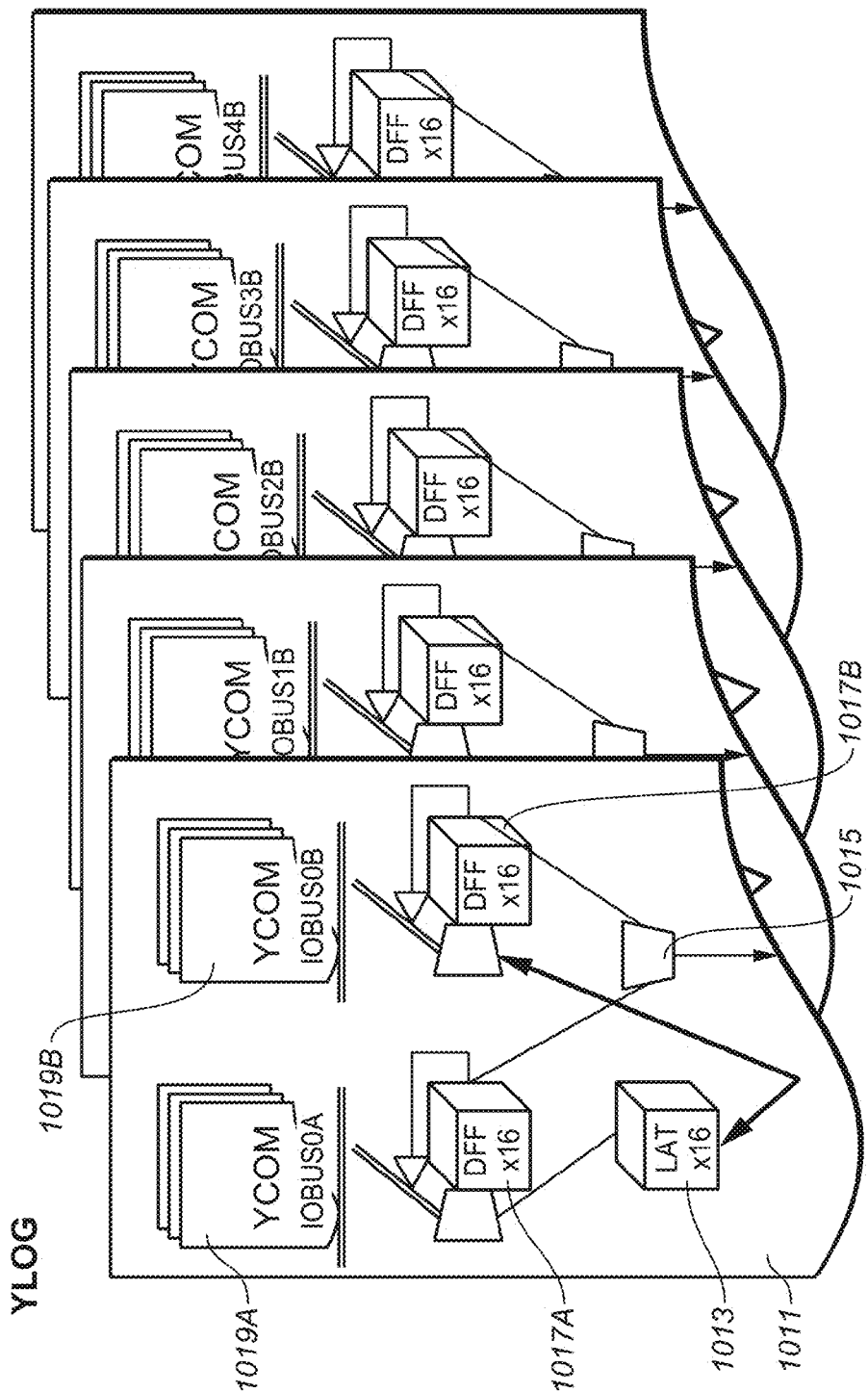
FIG. 32 gives some detail on the YLOG blocks of FIG. 31.
Figure 33:
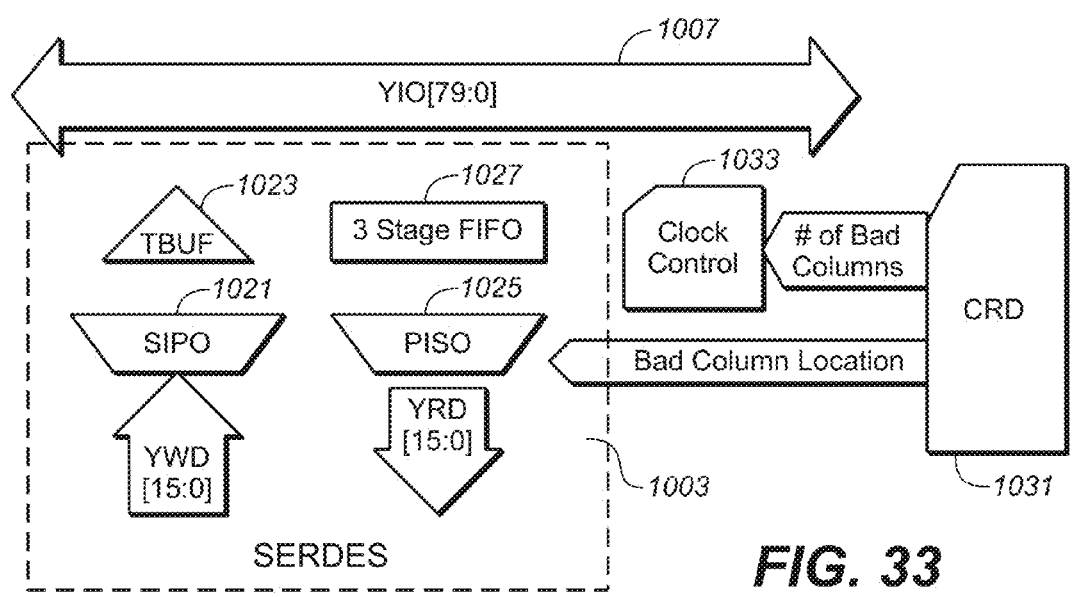
FIG. 33 is an overview of the structure of the SERDES block of FIG. 31.
Figure 34:
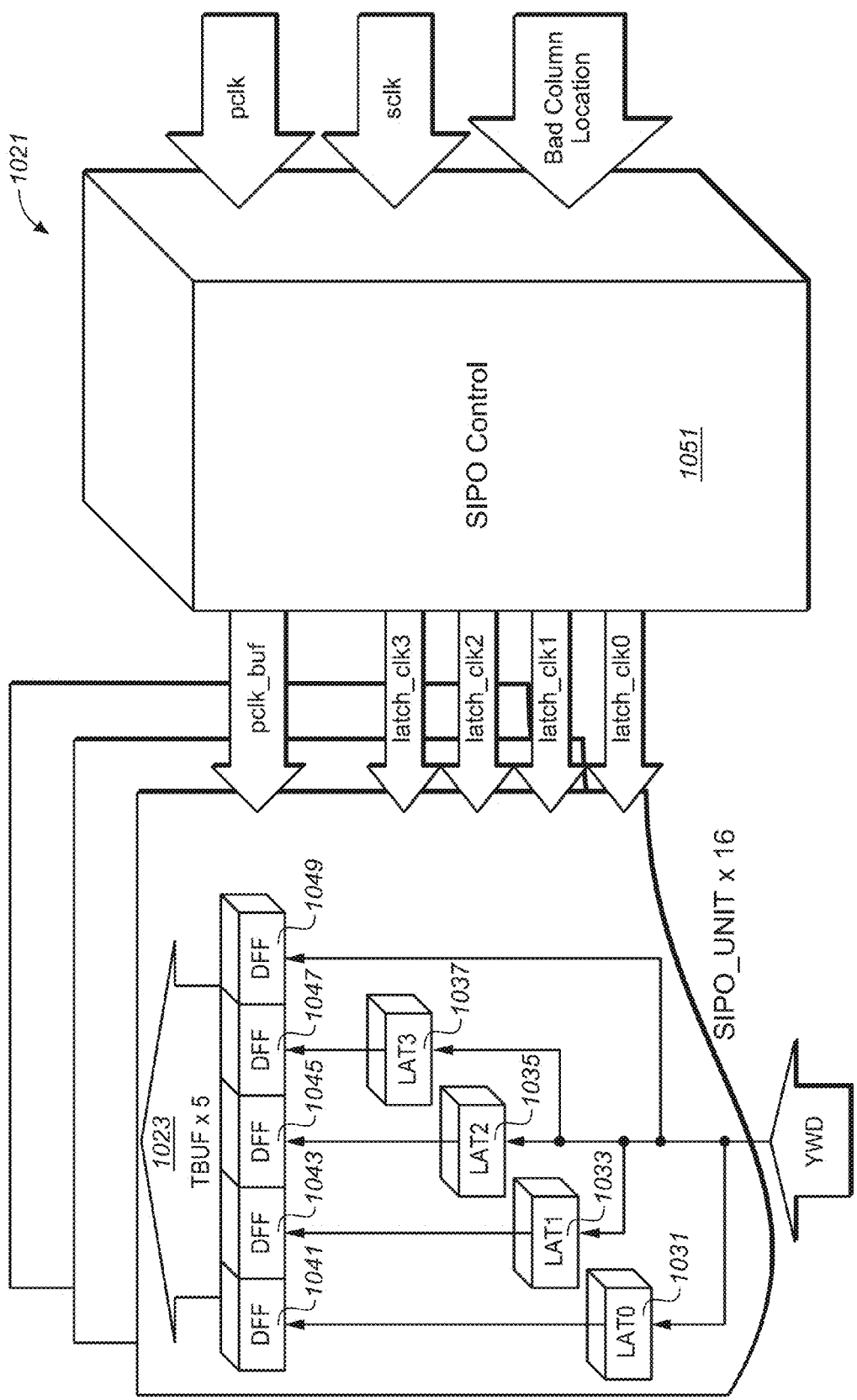
FIG. 34 looks at the SIPO path of FIG. 33 in more detail
Figure 35:
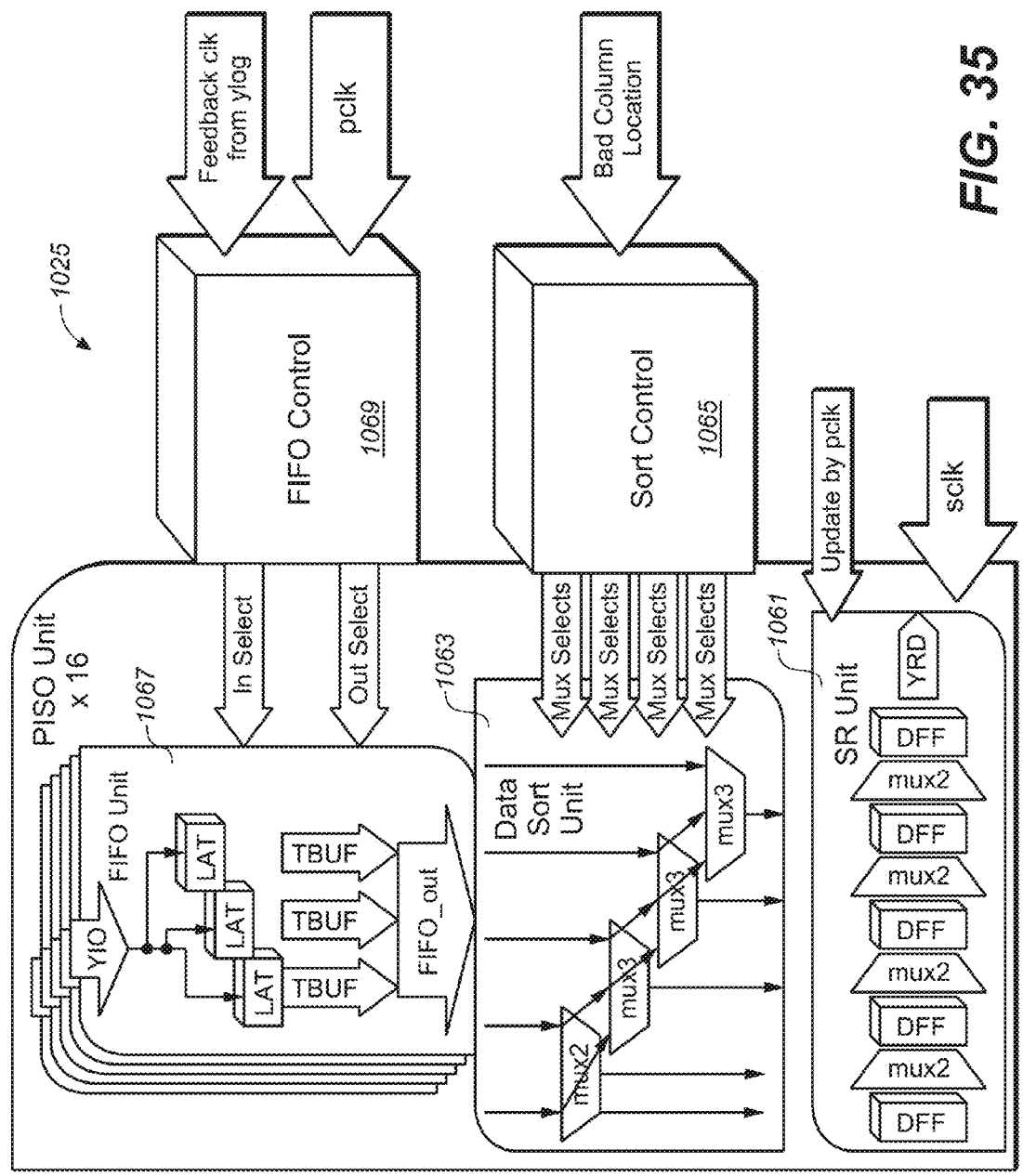
FIG. 35 looks at the PISO path of FIG. 33 in more detail

FIG. 31 is a relatively high level diagram of some of the elements involved, where the detail of FIG. 32 is YLOG_FB0 1001-0 and YLOG_FB1 1001-1 and FIGS. 33-35 provide detail on the SERDES block 1003. In FIG. 31 to the SERDES block 1003 is connected to the (16 bit word) serial data bus 1005 on one side and is connected to the 5 word wide parallel bus structure YIO[79:0] 1007 on the other side, and converts data from a serial to parallel format (on the way in) and from a parallel to a serial format (on the way out). (In this example, there are two arrays, each with 5 divisions, and the data is based on 16 bit works, but other values for all of these can be used according to the embodiment.) On the parallel side of SERDES 1003 the 5 words ([79:64], [63:48], [47:32], [31:16], [15:0]) are connected to YLOG_PB0 1001-0 and YLOG_PB1 1001-1 by the internal serial bus structure YIO[79:0]. The YLOG structure corresponds to column decoding and column ("Y") direction) oriented access circuitry that is peripheral to the memory array. Pages to be written and pages that have been read are stored in YLOG respectively after being received from and before being transferred to YIO 1007. In the exemplary embodiment, each of the 5 parallel division lines of YIO [79:0] 1003 connects to the YLOG circuitry of two arrays (or planes), with YLOG_PB0 101-0 for a plane 0 and YLOG_PB1 1001-1 for a plane 1. The lines of YIO 1007 are connected YLOG_PB0 1001-0 and YLOG_PB1 1001-1 by tri-state buffers (TBUFs) and with tri-state buffers also in the YIO 1007 between the YLOG_PB0 1001-0 and the YLOG_PB1 1001-1 portions, allowing the YIO lines to be selected connected to one or the other of YLOG_PB0 1001-0 or YLOG_PB1 1001-1.

In the embodiment of FIG. 31, in and out of YLOG_PB0 1001-0 and YLOG_PB1 1001-1 and in the different YIO lines between them and SERDES 1003 are various tri-state buffers (TBUFs) and FF+TBUF (flip-flop+tri-state buffer) elements, where a FF+TBUF can act as a flip-flop and then buffer, or just buffer. The choice between TBUF and FF+TBUF can be based on the data source/destination. In FIG. 31, for example, in data out from YLOG_PB1, all of YIO012[79:0] are just an extension from YIO_PC, so the "FF+TBUF" on the YIO012 near SERDES end is just a TBUF and the FF is bypassed. For data out from YLOG_PB0, the FF at the SERDES end is used, and TBUF between YIO_PC and YIO012 are all disabled. These elements help with the shared routing for YLOG_PB0 1001-0 and YLOG_PB1 1001-1 with SERDES 1003.

FIG. 32 gives some detail on the YLOG blocks and can be compared to the upper portion of FIG. 28, but where FIG. 28 is for a four division array while FIG. 32 is a five division embodiment. The elements YCOM and IOBUS elements 1019-A and 1019-B both correspond to the YCOM and IOBUS 901-0 of FIG. 28; and the DFFs 1017-A and 1017-B correspond to the top row DFF 911-0, and similarly for the other divisions. The reason for two of these element is because the exemplary embodiment uses a double data rate, or DDR, -type of arrangement to make 5 words into 10, further increasing the level of parallelism and improving performance. The Latch 1013 on the inbound path and the MUX 1015 on the outbound path used to implement this. These elements 1011 make up the DDR element for one division of YLOG 1001, with the structure repeated for the other elements. Additionally, it will be understood that by a DDR-type of arrangement, this can more generally be a branching of more than two (such as a triple or quadruple rate, for example). Also, it should again be noted that in FIG. 28 the serial to parallel and parallel to serial operations are performed by the elements (921-i) and (931-i) below the DFFs 911-i, whereas in the embodiments of this section illustrated with respect to FIG. 31, the data is in parallel form at this point, with the conversions moved out to the SERDES block 1003.

FIG. 33 is an overview of the structure of SERDES 1007. A serial in, parallel out (SIPO) unit 1021 serially receives write date words YWD[15:0], puts these into parallel format, and transfers them to the tri-state buffer 1023, and then onto YIO 1007. A 3 stage FIFO 1027 receives data in parallel from YIO 1007, provides it to the parallel in, serial out (PISO) unit 1025, which then serially outputs read words YRD[15:0]. The column redundancy circuit CRD 1031 supplied the bad column information to SIPO 1021 and PISO 1025 and the numbers of bad columns to the clock control circuit 1033.

FIG. 34 looks at the SIPO 1021 path in more detail. The serial data YWD comes in a word at a time and is loaded into the word wide data flip-flops 1041, 1043, 1045, 1047, and 1049, from where it can be transferred out in parallel according to the clock pclk_buf. In between, a set of latches LAT0 1031, LAT1 1033, LAT 1035, and LAT 1037 clocked by a corresponding clock latch_clk0, clock latch_clk1, clock latch_clk2, and clock latch_clk3 are used to provide the appropriate timing offsets in the serial to parallel conversion. These different clock signals are generated by the SIPO control block 1051 from the parallel clock pclk, the serial clock sclk, and the bad column information. As before, the bad column locations can skipped (or loaded with data that will be ignored) based on the bad column information to load data flip-flops corresponding to bad columns accordingly. The SIPO_UNIT×16 indicates that one unit handles 1 bit to 5 bits conversion in each SIPO_UNIT, which, when times 16 will convert a 16 bit to an 80 bit signal.

FIG. 35 looks at the PISO data path. At bottom is a serial (SR) unit 1061 of 5 data flip-flops controlled by the serial clock to output the read data YRD. In order to skip over any bad columns, between the DFFs are two-by MUXs updated by the parallel clock pclk, so that either the data from the preceding DFF can be passed or data from the corresponding MUX circuit of the data sort unit 1063. The data sort unit 1063 includes a set of MUXs to shift data forward to skip over any bad columns. In this way, the circuit of FIG. 35 operates similarly to that of FIG. 23, except now the three right-most MUXs are three-by MUXs, allowing up it to skip up to two columns ahead. (The left most MUX is only MUX2 as there is only one column left to skip and the left most word passes straight through to the left most DFF of SR unit 1061. The MUXs of the data sort unit are controlled by MUX select signals from the Sort control 1065 based on bad column information.

The input to the Data sort unit 1063 is the output of the FIFO_out of the FIFO unit 1067. As in FIG. 34, the unit×16 indicates that one unit handles 5 bits to 1 bit conversion in each PISO unit, which, when times 16 will convert an 80 bit to a 16 bit signal. This particular embodiment uses a 3-stage FIFO with three latches LAT fed from YIO 1007 according to an In select signal, which then pass to a corresponding tri-state buffer TBUF according to an out select signal. The in select and out select signals are generated by the FIFO control 1069 based on the parallel clock pclk and a feedback clock from YLOG.

In the embodiment of FIG. 35, one PISO unit has 5 FIFO_UNITs 1067, 1 data sort unit 1063, and 1 SR unit 1061. Each FIFO_UNIT has a 3 bit depth, 1 bit in and 1 bit out. The data sort unit 1063 has 5 bits in and 5 bits out, where each input bit connects to a FIFO_UNIT 1067. The shift register SR unit 1061 has 5 bits in and 1 bit out, taking the 5 bits of output from data sort unit based on "update by pclk". The furthest DFF has no MUX and always take new data every cycle.

CONCLUSION

Although the various aspects of the present invention have been described with respect to certain embodiments, it is understood that the invention is entitled to protection within the full scope of the appended claims.

What is claimed is:

1. A memory circuit comprising:
  a first array of non-volatile memory cells formed along a plurality of word lines and a plurality of columns, wherein the columns are subdivided into a plurality of N divisions, each of the plurality of N divisions formed of a plurality of contiguous columns, wherein the word lines span the columns of the first array;
  a first plurality of N sets of access circuitry, each connectable to the columns of a corresponding division of the first array, wherein N is an integer greater than one;
  a deserializer circuit connected to a data bus to receive data in a word-wide serial data format and connectable to the first plurality of N sets of access circuitry to transfer the received data thereto, wherein the deserializer circuit transfers each of N words of data to a corresponding one of the first plurality of N sets of access circuitry in parallel according to a first clock signal; and
  column redundancy circuitry connected to the deserializer circuit to provide defective column information thereto, whereby, in converting data from a serial to a parallel format, the deserializer circuit skips words of the data in the parallel format based on the defective column information indicating that the location thereof corresponds to a defective column.

2. The memory circuit of claim 1, wherein each of the N words of data is 16 bits in size.

3. The memory circuit of claim 1, further comprising:
  a clock control circuit connected to receive an input clock signal and connected to the column redundancy circuit, wherein the clock control circuit generates the first clock signal based upon the input clock signal and the defective column information.

4. The memory circuit of claim 1, wherein each of the first plurality of N sets of access circuitry includes a plurality of column write circuits, wherein the access circuitry transfers the parallel format data thereto according to a double data rate (DDR) type of arrangement.

5. The memory circuit of claim 1, further comprising:
  a second array of non-volatile memory cells formed along a plurality of word lines and a plurality of columns, wherein the columns of the second array are subdivided into another plurality of N divisions, each of the another plurality of N divisions formed of another plurality of contiguous columns, wherein the word lines of the second array span the columns of the second array; and
  a second plurality of N sets of access circuitry, each connectable to the columns of a corresponding division of the second array, wherein the deserializer circuit is connectable to the second plurality of N sets of access circuitry to transfer the received data thereto, each of N words of data being transferred to a corresponding one of the second plurality of N sets of access circuitry in parallel according to the first clock signal.

* * * * *